(12) United States Patent
Degner et al.

(10) Patent No.: US 10,606,325 B2
(45) Date of Patent: Mar. 31, 2020

(54) THERMAL MANAGEMENT COMPONENTS FOR ELECTRONIC DEVICES

(71) Applicant: Apple Inc., Cupertino, CA (US)

(72) Inventors: Brett W. Degner, Menlo Park, CA (US); Eric R. Prather, Portola Valley, CA (US); William K. Smith, San Francisco, CA (US); Anthony Joseph Aiello, Santa Cruz, CA (US); Jesse T. Dybenko, Santa Cruz, CA (US); Arash Naghib Lahouti, San Jose, CA (US); Kristopher P. Laurent, Campbell, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 15/994,753

(22) Filed: May 31, 2018

(65) Prior Publication Data
US 2018/0352676 A1 Dec. 6, 2018

Related U.S. Application Data

(60) Provisional application No. 62/514,676, filed on Jun. 2, 2017.

(51) Int. Cl.
*G06F 1/20* (2006.01)
*F28D 15/02* (2006.01)
(Continued)

(52) U.S. Cl.
CPC .............. *G06F 1/20* (2013.01); *F04D 25/166* (2013.01); *F04D 29/4226* (2013.01); *F04D 29/4246* (2013.01); *F04D 29/441* (2013.01); *F28D 15/0275* (2013.01); *F28F 1/325* (2013.01); *G06F 1/16* (2013.01); *G06F 1/1601* (2013.01); *G06F 1/206* (2013.01); *H05K 7/20136* (2013.01); *H05K 7/20154* (2013.01); *H05K 7/20172* (2013.01); *H05K 7/20336* (2013.01); *H05K 7/20972* (2013.01);
(Continued)

(58) Field of Classification Search
CPC . H05K 7/20136–10163; H05K 7/2029; H05K 7/20336; H05K 7/2099; H05K 7/20972; G06F 1/20
USPC ......... 361/695, 700, 679.47, 679.48–679.52; 165/80.4–80.5, 104.33
See application file for complete search history.

(56) References Cited

U.S. PATENT DOCUMENTS 5,966,286 A 10/1999 O'Connor et al.
6,118,654 A 9/2000 Bhatia
(Continued)

*Primary Examiner* — Zachary Pape
(74) *Attorney, Agent, or Firm* — Dickinson Wright RLLP

(57) ABSTRACT

A thermal management system that includes a fan assembly, a heat exchanger, and an insulating box is described. The fan assembly can have two impellers and a housing that includes two scroll portions. An internal portion of the scroll wall can be truncated. A motor housing can be connected to the fan housing via multiple struts. The struts can be oriented angularly with a tangential component and can slope inward to increase the effective inlet area. The heat exchanger can be formed of a fin stack that has a curved body that defines an airflow path that turns radially from the inlet to the exhaust. The heat exchanger can have an inlet that is smaller than the exhaust. The heat exchanger can be connected to one or more heat pipes. The insulating box can have a grid that directs air to certain specific directions.

15 Claims, 16 Drawing Sheets

(51) Int. Cl.
    *H05K 7/20* (2006.01)
    *F28F 1/32* (2006.01)
    *G06F 1/16* (2006.01)
    *F04D 29/42* (2006.01)
    *F04D 25/16* (2006.01)
    *F04D 29/44* (2006.01)
    *F28D 21/00* (2006.01)

(52) U.S. Cl.
    CPC .. *F28D 2021/0029* (2013.01); *F28F 2250/08* (2013.01); *F28F 2250/102* (2013.01); *G06F 2200/1612* (2013.01); *G06F 2200/1631* (2013.01)

(56) References Cited

U.S. PATENT DOCUMENTS

| | | | | |
|---|---|---|---|---|
| 6,396,688 B1* | 5/2002 | Davies | ...................... | G06F 1/20 361/51 |
| 7,417,856 B2* | 8/2008 | Chiu | ..................... | F04D 25/166 361/694 |
| 7,458,767 B2* | 12/2008 | Wu | ........................... | F01D 1/02 415/204 |
| 7,529,088 B2* | 5/2009 | Chiu | .................... | F04D 29/161 361/695 |
| 8,133,005 B2* | 3/2012 | Hsu | ....................... | F04D 25/166 415/203 |
| 8,270,166 B2* | 9/2012 | Chen | .................. | F28D 15/0233 165/104.33 |
| 8,333,547 B2* | 12/2012 | Hsu | ........................ | F04D 17/16 415/60 |
| 9,087,804 B2* | 7/2015 | Wong | ..................... | H01L 23/34 |
| 9,239,598 B2* | 1/2016 | Degner | ..................... | G06F 1/20 |
| 9,551,352 B2* | 1/2017 | MacDonald | .......... | F04D 29/281 |
| 2011/0085288 A1* | 4/2011 | Lai | .......................... | G06F 1/184 361/679.21 |
| 2011/0310557 A1 | 12/2011 | Ooe | | |
| 2013/0279112 A1* | 10/2013 | Kim | .................. | H05K 7/20154 361/692 |
| 2014/0320752 A1* | 10/2014 | Kawasaki | .............. | H04N 5/655 348/836 |
| 2014/0334094 A1* | 11/2014 | Huang | .................... | G06F 1/203 361/679.47 |
| 2016/0221139 A1 | 8/2016 | Seitz et al. | | |
| 2017/0094835 A1 | 3/2017 | Prather et al. | | |

* cited by examiner

THERMAL MANAGEMENT COMPONENTS FOR ELECTRONIC DEVICES

CROSS-REFERENCE TO RELATED APPLICATION

This application claims the benefit of U.S. Provisional Application No. 62/514,676, filed Jun. 2, 2017, entitled "THERMAL MANAGEMENT COMPONENTS FOR ELECTRONIC DEVICES", which is incorporated by reference herein in its entirety.

FIELD

Embodiments of the present invention relate generally to thermal management components for electronic devices. More specifically, the described embodiments include devices and structures that improve the cooling efficiency of electronic devices.

BACKGROUND

Most electronic devices generate enough heat to require some forms of cooling processes in order to dissipate the heat and prevent overheating conditions in the device. One way devices are kept cool is by circulating air into and out of electronic device enclosures. As the sizes of electronic devices are becoming increasingly more compact, the efficiency of cooling processes should be improved.

SUMMARY

This paper describes various components and structure of an electronic device that improves the heat dissipation efficiency of the electronic device.

According to an embodiment, an electronic device is described. The electronic device can include a housing that defines an internal volume. The internal volume can include a first region and a second region. The first and second region can be disposed about a midline. The housing can carry an air mover assembly that includes a single exhaust, a first air mover operable to move air primarily from the first region towards the exhaust in a first airflow and a second air mover operable to move air primarily from the second region towards the exhaust in a second airflow. The first and second airflows can merge to form a combined airflow upstream of the exhaust. The electronic device can further include a first heat-generating component located in the first region, a second heat-generating component located in the second region, and a heat exchanger connected to and capable of receiving the combined airflow from the single exhaust and directing the airflow out of the housing. The heat exchanger can be thermal conductively connected to the first and second heat-generating components.

According to another embodiment, a fan assembly for an electronic device is described. The fan assembly can include a housing that includes a single exhaust, separate inlet openings and two impellers, each impeller being fed via separate inlet openings. Each of the inlet openings can receive airflows that are independent of each other. A truncated interior wall can allow the independent airflows to merge and form a combined airflow upstream of the exhaust. A single exhaust can receive the combined airflow and pass the combined airflow out of the fan housing. The housing can further include a motor housing integrally formed with struts that slope inward and that are angularly oriented to align a tangential component of the local airflow. The struts can connect the fan housing to the circumference of the motor housing.

According to yet another embodiment, a heat exchanger for an electronic device is described. The heat exchanger can include fins. Each of the fins can be characterized as having a first side edge and a second side edge that is non-adjacent to the first side edge. The fins can be stacked together such that first side edges of the fins cooperate to define an inlet of the heat exchanger and second side edges of the fins cooperate to define an exhaust of the heat exchanger. The first side edges can be non-parallel to the second side edges such that an airflow path of the heat exchanger can turn radially from the inlet to the exhaust.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which:

In FIG. 7A, the fan assembly is illustrated to be in position with enclosures of an electronic device in accordance with some embodiments.

Figure 1:
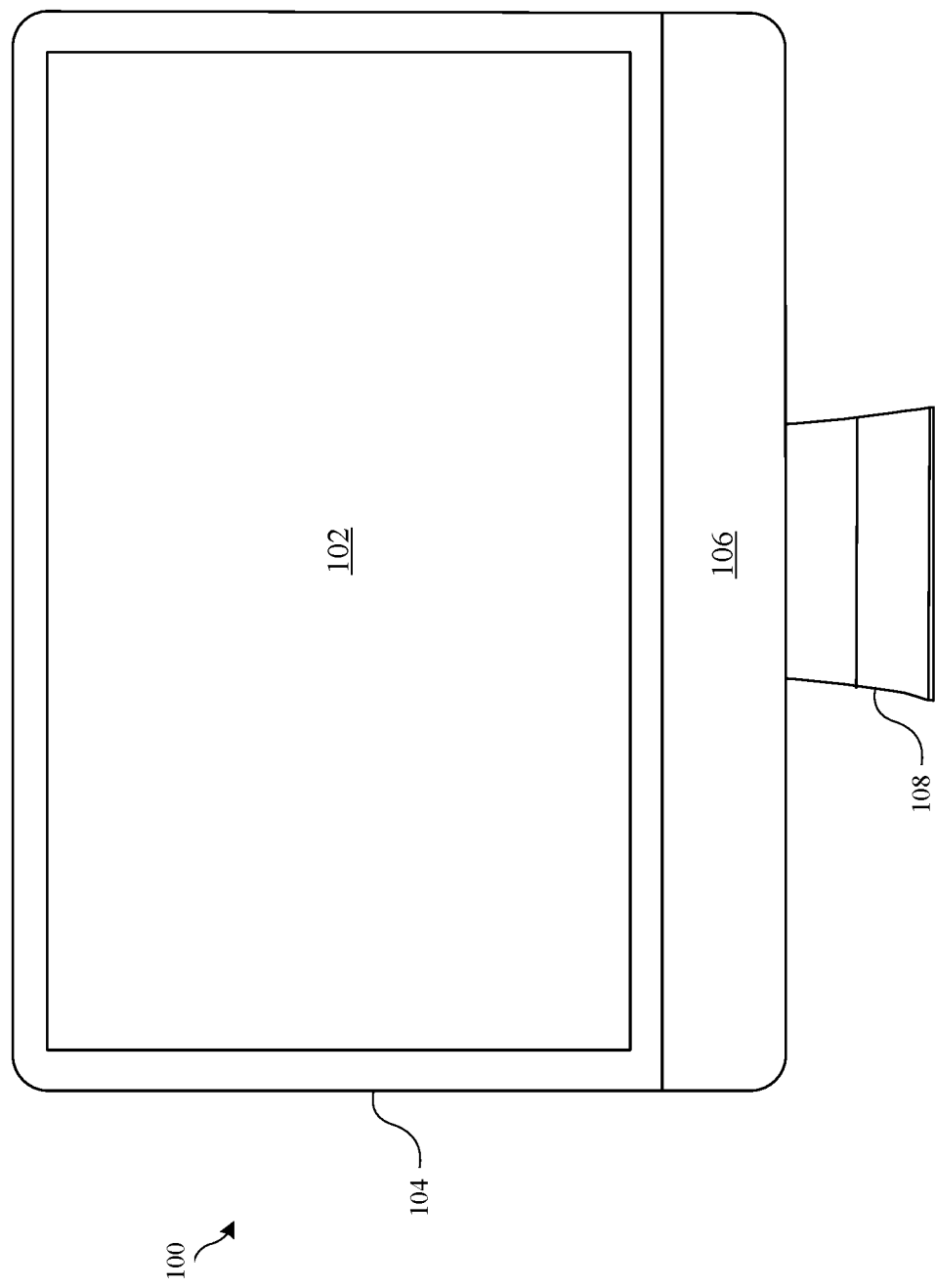
FIG. 1 illustrates a front view of an electronic device in accordance with some embodiments.

Those skilled in the art will appreciate and understand that, according to common practice, various features of the drawings discussed below are not necessarily drawn to scale, and that dimensions of various features and elements of the drawings can be expanded or reduced to more clearly illustrate the embodiments of the present invention described herein.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Increasingly, electronic devices can use more powerful processing and storage components while simultaneously continue to shrink in overall size. One way to further reduce the size of an electronic device is to taper the edges of the housing. Unfortunately such tapering of the housing can reduce the internal space of the electronic device in which internal components can be fitted. Although cooling devices can be used to dissipate heat accumulated at and near heat-generating components, significant airflow is often required to adequately cool those components. Optimizing the airflow inside an electronic device can be challenging, as increasing the sizes of cooling devices can sometimes be prohibited by the space restrictions imposed by structures around the cooling devices.

Embodiments described herein relate to devices, systems, and methods that improve the heat dissipation efficiency of an electronic device. In terms of the overall architecture, a thermal management system of the electronic device in accordance with some embodiments can include inlet and outlet vents on the housing of the electronic device, a fan assembly, a heat exchanger, and an insulating box. Air can be drawn into the internal volume of the electronic device by the fan assembly through the inlet vents. The exhaust of the fan assembly can be connected to the heat exchanger so that air can be blown through the heat exchanger, which can be thermally connected to heat-generating components. The heated air from the heat exchanger can then exit the electronic device at the outlet vents, which can be located above the inlet vents so that the heated air will not re-circulate back into the electronic device.

The components of the thermal management system in accordance with some embodiments can be arranged in a first side and a second side (for example, left and right but the arrangement can also be in other directions) of the electronic device to promote a more even temperature distribution in the electronic device. In some embodiments, the fan assembly can be a double impeller fan assembly so that air is drawn from both sides of the electronic device. A first impeller can be located in the first side and a second impeller can be located in the second side so that the first impeller and the second impeller are operable to move air primarily from the first side and from the second side, respectively. Two major heat-generating components, such as a central processing unit (CPU) and a graphics processing unit (GPU), can be separately located on each side of the internal volume. The first heat-generating component can be connected through heat pipes to the heat exchanger from a first side of the heat exchanger while the second heat-generating component can be connected through heat pipes to the heat exchanger from a second side of the heat exchanger. In some cases, a processor in communication with temperature sensors can control the double impeller fan assembly to adjust the speeds of the impellers based on the temperatures and/or the activity levels of the heat-generating components. For example, if a heat-generating component on the first side is generating a larger amount of heat compared to another heat-generating component on the second side, the speed of the first impeller can increase above the speed of the second impeller to promote air circulation on the first side of the electronic device.

A fan assembly, in accordance with some embodiments, can include different features that improve aerodynamic efficiency, reduce turbulence and promote more uniform flow without increasing its size. The fan assembly can be a double impeller fan assembly having two scroll portions arranged symmetrically along a midline. The housing parts of the two scroll portions can be integrated to form a single fan housing having a single exhaust outlet. Along the midline where the two scroll portions merge, an internal wall of the fan housing that is largely along the midline can be truncated such that the separate airflow distributions from the two scroll portions can merge and settle before reaching the exhaust. This truncation of that internal wall can promote more uniform flow distribution and can increase the flow rate of the fan assembly.

For each scroll portion, the fan assembly can include an impeller inside the fan housing. The fan housing can have a first opening above the impeller and a second circular opening below the impeller, or vice versa. Both openings can serve as inlets through which air is drawn into the fan assembly. The impeller can be driven by a motor that is located inside a circular motor housing and be supported by a bearing that is also located inside the motor housing. The motor housing can be located at the center of the second opening and can be mounted to the fan housing through a number of struts. Because some of the space of the second opening is occupied by the motor housing and the struts, the second opening can be divided by the struts into multiple opening spaces. For the same reason, the total opening spaces of the second opening can be smaller than that of the first opening. Hence, the first opening can serve as a primary inlet while the opening spaces of the second opening can serve as secondary inlets.

The fan assembly can be positioned and oriented in the electronic device to maximize the efficiency of both primary and second inlets. For example, the fan assembly can be positioned relative to a main logic board (MLB) of the electronic device such that air drawn through the primary inlet mainly comes from a first side of the MLB while air drawn through the second inlet mainly comes from a second side of the MLB opposite the first side. The ratio of airflow rate of the primary inlet to that of the secondary inlets can match the desired ratio of airflow rate of the first side of the MLB to that of the second side so that cooling can be optimized. In addition, the impeller's blade-support disc can be positioned at an elevation (i.e. vertical level relative to the height of the impeller) that matches the airflow ratio of the primary inlet to the secondary inlets to maximize the efficiency of the fan assembly.

To improve the aerodynamic efficiency of the fan assembly, especially near the secondary inlets, the struts can be specifically shaped, oriented, and positioned in certain ways. Viewed from the surface of the fan assembly, the struts can be oriented tangentially to the circumference of the circular motor housing. This orientation aligns with the airflow at the secondary inlets and, thus, reduces entrance losses and the impedance on the airflow. Also, the clock position of the struts at the second opening can be specifically determined to avoid high airflow suction regions because the airflow at the second opening is not uniform at different clock positions. Viewed from the cross section of the fan assembly, the struts can slope towards the impeller (i.e. sinking toward the interior of the fan housing). The sloped struts can increase the height of the opening spaces that serve as the secondary inlets, thereby increasing the effective size of the secondary inlets.

A heat exchanger, in accordance with some embodiments, can work well with other components described herein and at the same time improve aerodynamic and heat dissipation efficiency of the electronic device. The inlet of the heat exchanger can be connected to the exhaust of a fan assembly while the exhaust of the heat exchanger can be connected to the outlet vents of the housing of the electronic device. Hence, the design of the heat exchanger may be affected by the fan assembly and the outlet vents. For example, to increase the airflow of the fan assembly, the exhaust of the fan assembly can be wide but short in height because the height of the fan assembly may be restricted by the thickness of the electronic device. On the other hand, the outlet-vent area of the housing can be in a rectangular shape that is close to a square. Therefore, a heat exchanger that fits this system may be required to transition from a flattened inlet to a nearly square exhaust. The heat exchanger in accordance with some embodiments can include multiple cooling fins that are fastened together. The heat exchanger can include an inlet that is in a trapezoidal shape and an exhaust that is close to a square. The cooling fins can be oriented at slightly different angles so that the cooling fins gradually taper towards the legs of the trapezoid. This configuration can allow airflow to smoothly transition from the shape of the inlet to the shape of the exhaust.

Moreover, the heat exchanger can be connected to one or more heat pipes that draw heat conductively from some heat-generating components. The heat pipes can be flattened and be oriented based on the airflow of the heat exchanger so that the airflow is not impeded by the presence of the heat pipes. In some cases, two heat-generating components can be connected to the heat exchanger from opposite sides of the heat exchanger. Each of the two heat-generating components can be connected to two or more heat pipes. At the heat exchanger, the heat pipes from the first heat-generating component and the heat pipes from the second heat-generating component can be arranged in an interleaved manner so that both heat-generating components can be evenly cooled.

In some embodiments, an insulating box can be arranged between the heat exchanger and the outlet vents. The insulating box can be a grid like structure and can include vertical and horizontal strips that cooperate to form multiple openings for air to pass through the insulating box. The insulating box can cover the housing near the area of output vents on the side of housing that is facing the heat exchanger. The insulating box can be formed from a polymer material so that the insulating box can provide thermal insulation to the housing at the area of output vents to reduce the temperature of the housing at that area. Moreover, the vertical and horizontal strips can have aerodynamically contoured edges so that the airflow meeting the strips can be driven according to the orientations and the shapes of the strips. The strips can point to certain specific directions so that air can be directed by the insulating box to exit the electronic device at certain preferred angles that promote air circulation of the electronic device. For example, in some cases, each of the horizontal strips of insulating box can be in a triangular shape and be oriented such that a vertex of the triangle can point to the heat exchanger and a side of the triangle can slope upward. Hence, the horizontal strips can direct the air to exit the electronic device at a slightly upward direction. As such, heated air will not re-enter the electronic device through the inlet vents, which can be located below the outlet vents. In some cases, the outlet vents can be hidden behind a stand of the electronic device. The vertical strips of insulating box can be separated into a first group and a second group. The first group can point sideway in a first direction while the second group can point sideway in a second direction opposite the first direction. Hence, the vertical strips can direct the air to exit the electronic device at either sideway direction (instead of exiting straight) so that majority of the outgoing air will not impinge on the stand.

These and other embodiments are discussed below with reference to FIGS. 1-17; however, those skilled in the art will readily appreciate that the detailed description given herein with respect to these figures is for explanatory purposes only and should not be construed as limiting.

FIG. 1 illustrates an exemplary front view of an electronic device 100 in accordance with some embodiments. Electronic device 100 can contain a display portion 102. Display portion 102 can be made from any modern display technology such as liquid crystal display (LCD, or organic light emitting diode (OLED) technology). Display portion 102 can be covered and protected by display cover 104 which can be made of any thin translucent material such as glass or hardened plastic. As shown display cover 104 can extend past the edges of display portion 102, giving the top portion of electronic device 100 a uniform appearance. Housing 106 and display cover 104 can cooperate to form an enclosure that encases the internal components of electronic device 100. Housing 106 can be made of any rigid material sturdy enough to support the internal components. Electronic device 100 can be supported by stand 108. Stand 108 can be rotatably connected to the back of housing 106, allowing housing 106 to rotate at least up and down for adjusting the view angle of display portion 102.

Figure 2:
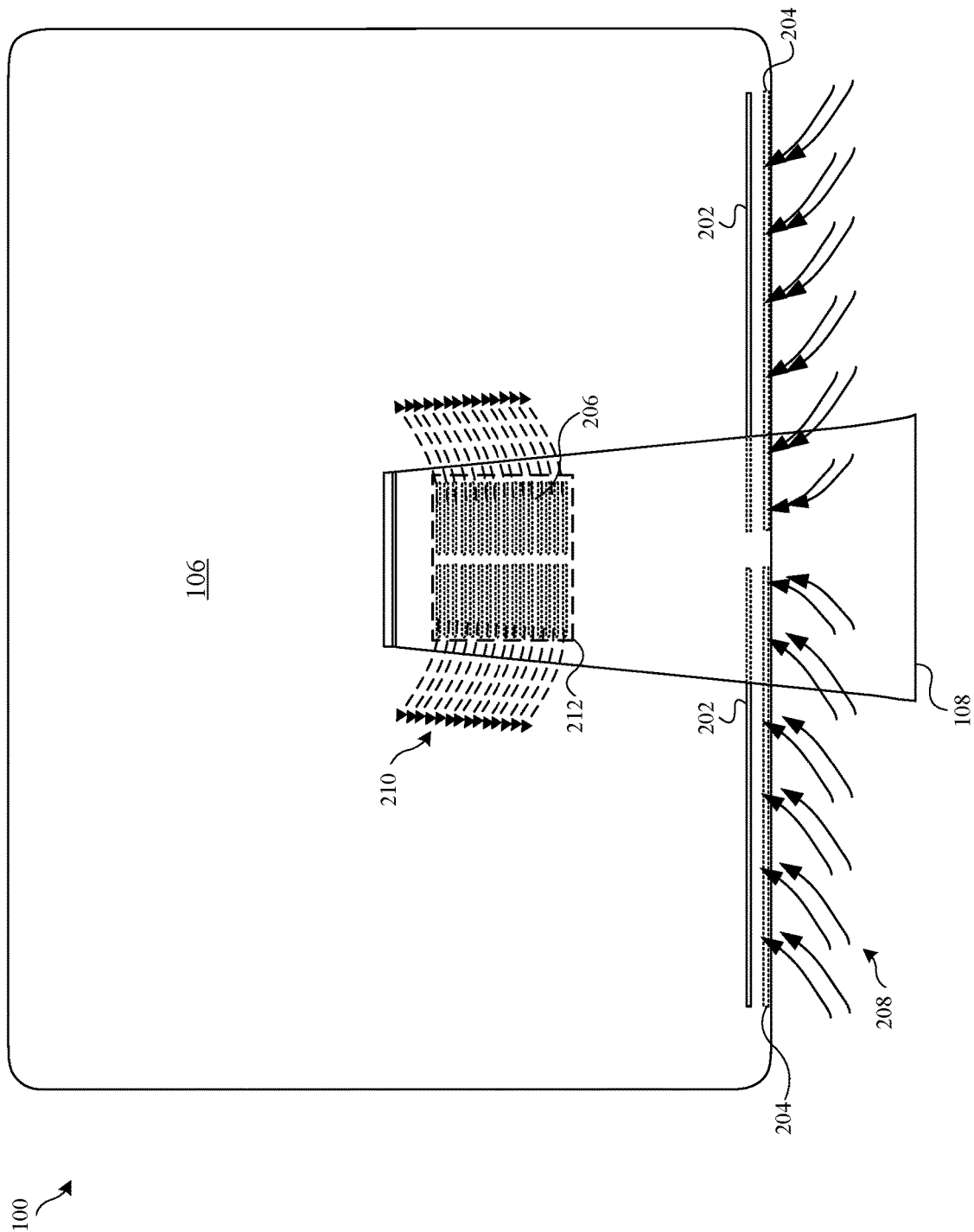
FIG. 2 illustrates a rear view of an electronic device in accordance with some embodiments.

FIG. 2 shows an exemplary rear view of electronic device 100 illustrating the positions of vents and the directions of airflow in and out of electronic device 100 in accordance with some embodiments. Electronic device 100 can include a first set of inlet vents 202 and a second set of inlet vents 204. Second set of inlet vents 204 can be located along a bottom edge of housing 106. Second set of inlet vents 204 are represented by dashed boxes because the second set of inlet vents 204 may not be visible from a rear view of electronic device 100. Electronic device 100 can additionally include a set of outlet vents 206 that can be located above both the first and second sets of inlet vents 202 and 204. Incoming cool air 208 can enter through the inlet vents 202 and 204 and circulate inside housing 106 to carry heat away from the internal components. Heated outgoing air 210 can then be expelled through the outlet vents 206 and carry the heat away from electronic device 100.

An insulating box 212 (represented by a dashed box) can be located inside housing 106 and at the area of outlet vents 206. The insulating box 212 can control the direction of the outgoing air 210 so that outgoing air 210 can exit leftward for the left column of output vents 206 and can exit rightward for the right column of output vents 206. The insulating box 212 can also adjust the vertical angle of outgoing air 210 so that outgoing air 210 can be expelled in a direction away from incoming air thereby minimizing any thermal interaction between the two airflows. More specifically, since the inlet vents 202 and 204 can be located below outlet vents 206, directing the outgoing air 210 to exit at some slightly upward directions (or at least horizontally) can promote air circulation and prevent heated air from re-entering electronic device 100. The structure of an exemplary insulating box will be discussed in a more detailed manner below. It should be noted that the set of outlet vents 206 can be positioned behind stand 108 so that the vents 206 can be hidden from sight. The second set of inlet vents 204 can also be positioned at the bottom edge of housing 106 so that the vents 204 are less noticeable. Those positions of the vents can improve the appearance of the electronic device 100.

Figure 3:
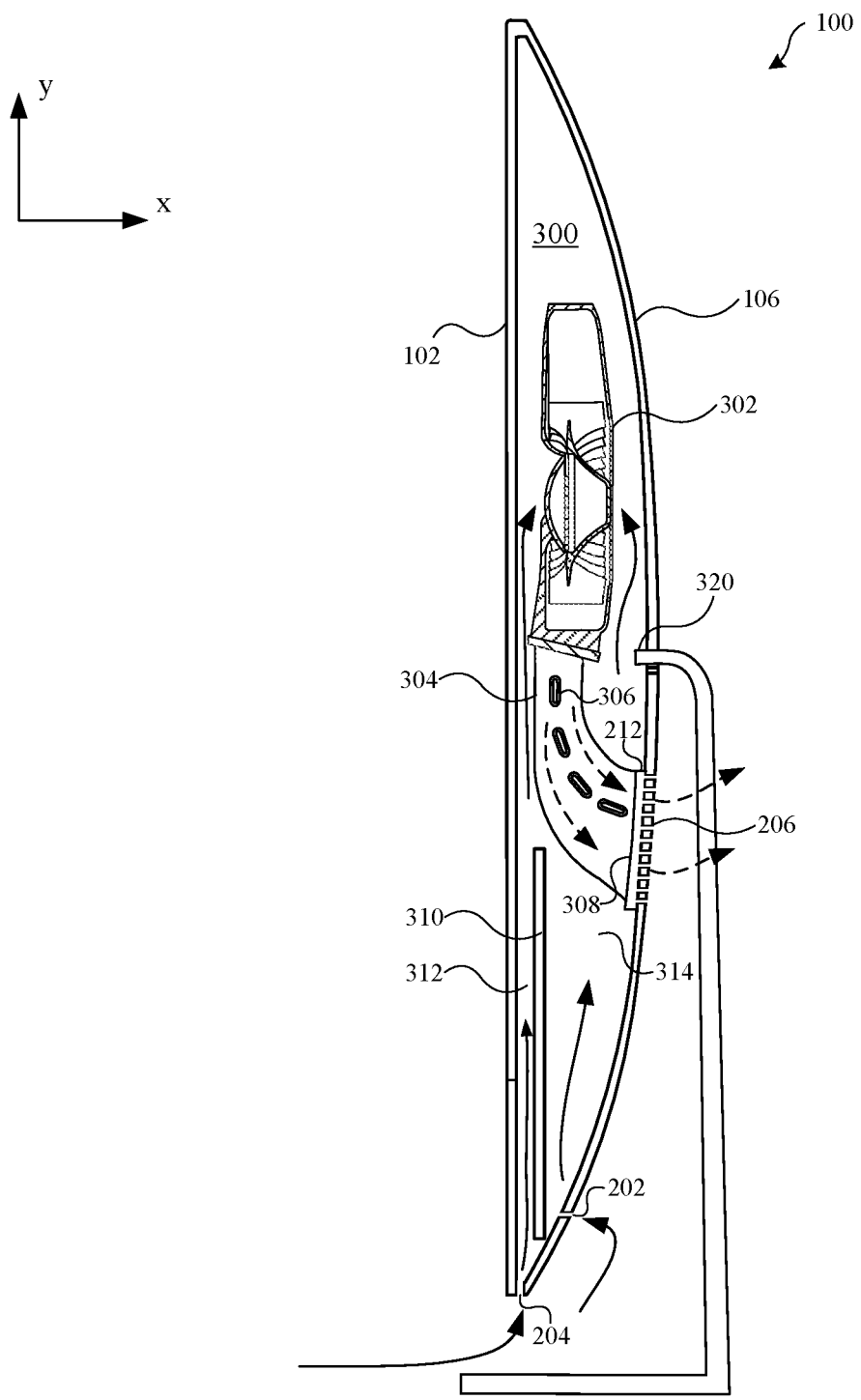
FIG. 3 illustrates a cross-sectional side view of an electronic device in accordance with some embodiments.

FIG. 3 shows a cross-sectional view of electronic device 100 and illustrates an internal volume 300 defined by housing 106 of electronic device 100 in accordance with some embodiments. As shown, housing 106 can have a convex shape so that internal volume 300 can be thicker near the center and become narrower as housing 106 tapers towards the edges (which can include top, bottom and side edges). This convex shape of housing 106 can allow electronic device 100 to be perceived as having a very thin body and to be aesthetically pleasing.

Electronic device 100 can include a fan assembly 302, a heat exchanger 304, and the insulating box 212. Detailed exemplary structures of those internal components will be discussed below. Fan assembly 302 can be an air mover assembly that is responsible for drawing air into and expelling air out of housing 106. Fan assembly 302 can be arranged just above the thickest portion of internal volume 300, thereby nearly maximizing the amount of room allowed for fan assembly 302 and the amount of air accessible to fan assembly 302. Fan assembly 302 can be mechanically coupled to heat exchanger 304 that can receive the airflow from an exhaust of fan assembly 302 and pass the heated airflow out of internal volume 300 and housing 106. Heat exchanger 304 can be coupled to one or more heat pipes 306 that conductively draw heat from some heat-generating components. At the exhaust side 308 of heat exchanger 304, the insulating box 212 can be located to adjust the travel angle of outgoing air.

FIG. 3 also illustrates an advantage of having two sets of inlet vents 202 and 204 in accordance with some embodiments. A printed circuit board (PCB) 310 or other heat-generating component can be located in the internal volume 300 and can be used to bifurcate a portion of internal volume 300 into a front portion 312 that is near display portion 102 and a back portion 314 that is near the backside of housing 106. As illustrated by the airflow arrows, having a first set of inlet vents 202 at the backside of housing 106 can allow air to enter internal volume 300 through the back portion 314. In addition, having a second set of inlet vents 204 at the bottom edge of housing 106 can allow air to enter internal volume 300 through the front portion 312. Hence, having both sets of inlet vents 202 and 204 can allow air to travel though both sides of PCB 310 to promote heat dissipation of PCB 310. In some embodiments, the total size of the first set of inlet vents 202 relative to the total size of the second set of inlet vents 204 can depend on the relative approximate volume ratio of back portion 314 to front portion 312. For example, if the volume of back portion 314 to the volume of front portion 312 is roughly 2:1, the total size of first set of inlet vents 202 can be approximately double of the total size of second set of inlet vents 204. This arrangement can allow maximum efficiency of airflow in internal volume 300.

Figure 4A:
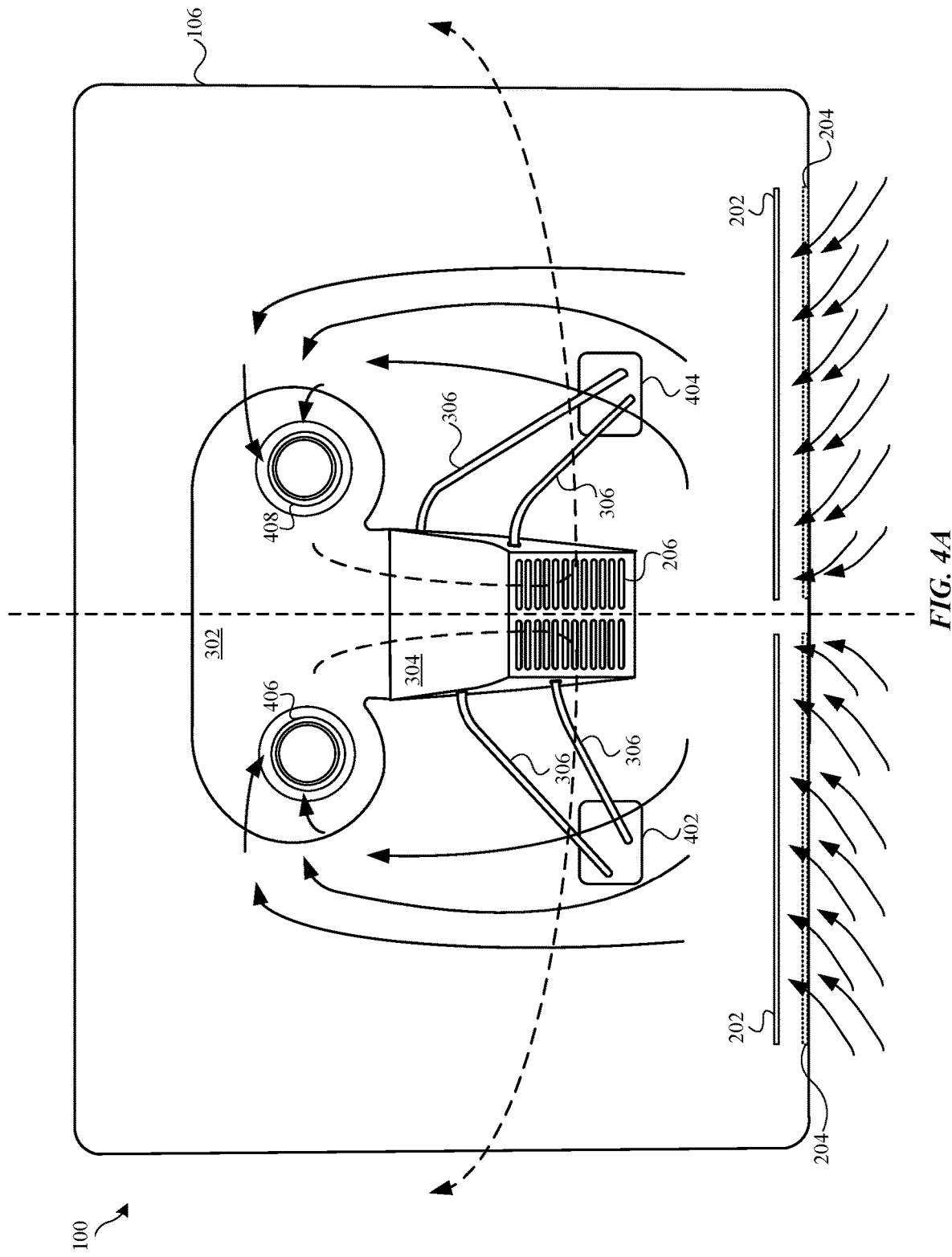
FIG. 4A illustrates a rear internal view showing some internal components of an electronic device in accordance with some embodiments.

FIG. 4A illustrates a rear cross-section view of electronic device 100 in accordance with some embodiments. FIG. 4A shows fan assembly 302, heat exchanger 304, inlet vents 202 and 204, and outlet vents 206. Housing 106 can be described as an area being divided by a dashed midline into a first region and a second region, illustrated herein as a left region and a right region. It should be noted that housing 106 can also be divided into any other suitable divisions such as top and bottom, specific quadrants, or other identifiable, symmetrical or not, regions. Fan assembly 302 can be a centrifugal fan assembly with two air movers 406 and 408 that draw air from both sides of internal volume 300. In some cases, the air movers can include impellers that are driven by motors. A first air mover 406 can be located in the first region and a second air mover 408 can be located in the second region so that first air mover 406 is operable to move air primarily from the first region and second air mover 408 is operable to move air primarily from the second region. Heat exchanger 304 can be coupled with multiple heat pipes 306 that are connected to one or more heat generating components so that heat exchanger 304 is thermal conductively connected with the one or more heat-generating components. In the particular configuration shown in FIG. 4A, a first heat-generating component 402 can be located in the first region while a second heat-generating component 404 can be located in the second region. Two heat pipes 306 can thermal conductively connect first heat-generating component 402 to heat exchanger 304 to allow heat generated from first heat-generating component 402 to transfer conductively to heat exchanger 304. Other two heat pipes 306 can thermal conductively connect second heat-generating component 404 to heat exchanger 304. The detailed arrangement among the heat-generating components, the heat pipes and the heat exchanger will be discussed below.

First heat-generating component 402 can be a central processing unit (CPU) of electronic device 100 and second heat-generating component 404 can be a graphics processing unit (GPU) of electronic device 100, or vice versa. The CPU and GPU can be major heat-generating sources in electronic device 100. First heat-generating component 402 and second heat-generating component 404 can be separately positioned at each side of electronic device 100. For example, from the perspective shown in FIG. 4A, first heat-generating component 402 can be located in the first region while second heat-generating component 404 can be located in the second region. The separation of first and second heat-generating components 402 and 404 can improve thermal distribution inside electronic device 100, thus improving heat dissipation efficiency of electronic device 100. In addition, the fan assembly 302 can have one air mover rotate faster than another air mover to avoid acoustic modulation, which will be discussed in detail below. Separating two heat-generating components to different sides can allow the heat-generating component with more heat generation to be located on the same side as the faster air mover. For example, if the GPU usually generates more heat than the CPU, the GPU can be located on the same side as the faster air mover.

Figure 4B:
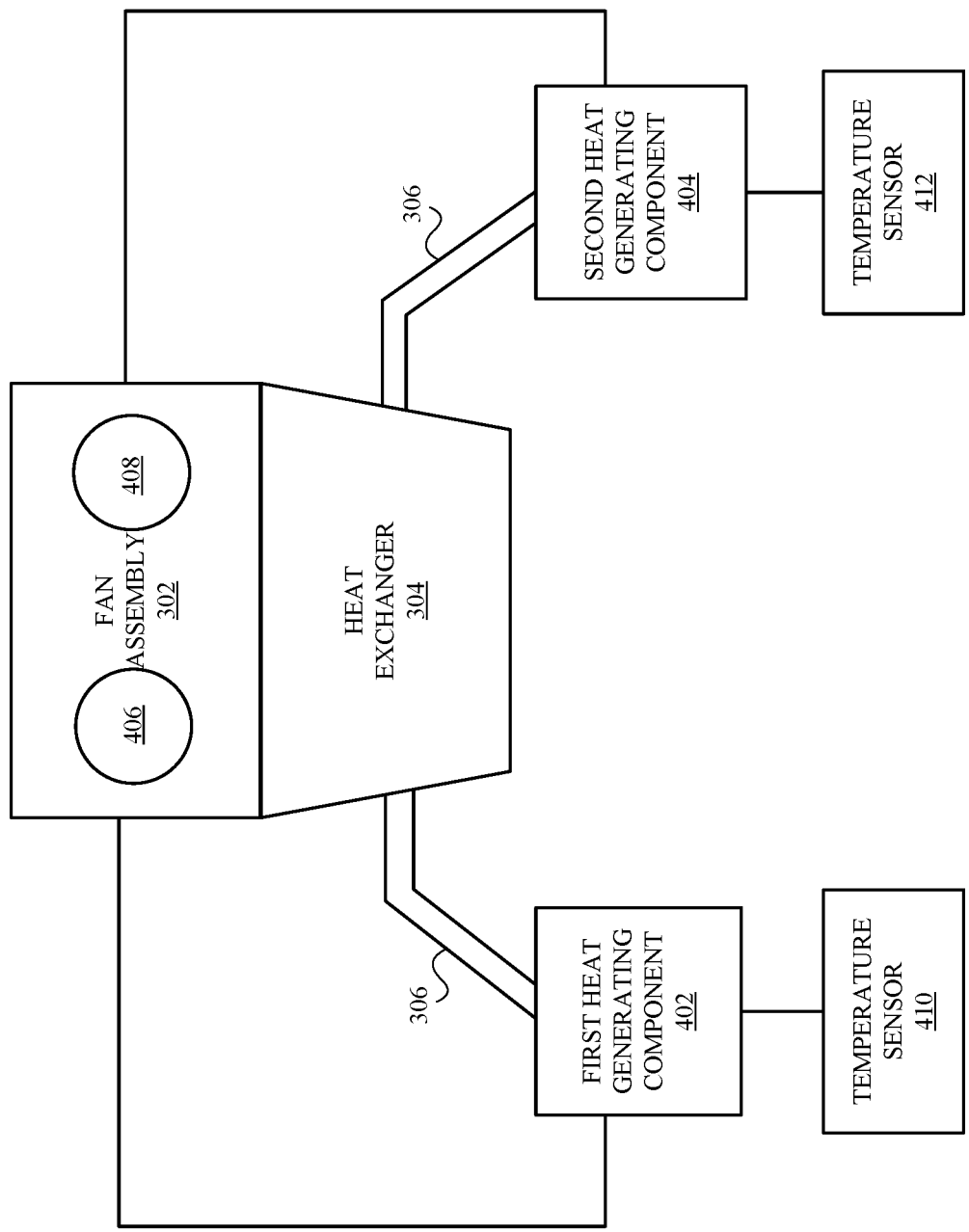
FIG. 4B illustrates a block diagram of several internal components of an electronic device in accordance with some embodiments.

FIG. 4B is a block diagram illustrating the relationship among fan assembly 302, heat exchanger 304, first heat-generating component 402, and second heat-generating component 404. First heat-generating component 402 and second heat-generating component 404 can be located on opposite sides of a housing of an electronic device. Heat exchanger 304 can be conductively connected to heat-generating components 402 and 404 through heat pipes 306 to draw heat away from those processors. Fan assembly 302 can draw air to travel through the surface of heat-generating components 402 and 404 to further carry heat away from those processors through convection. The air drawn into fan assembly 302 can then be expelled through heat exchanger 304 and exit the electronic device 100. In addition, either or both heat-generating components 402 and 404 can be electrically connected to fan assembly 302 so that heat-generating components 402 and/or 404 can control the speeds of the two air movers 406 and 408 of fan assembly 302. First and second heat-generating components 402 and 404 can include or be connected to temperature sensors 410 and 412. In some cases, the speeds of the air movers 406 and 408 can be adjusted based on the temperatures and/or activity levels of first heat-generating component 402 and second heat-generating component 404. Which air mover rotates faster can depend on the relative temperatures and/or activity levels of heat-generating components 402 and 404. For example, when first heat-generating component 402, which can be a processor, is performing a large amount of calculations, first heat-generating component 402 can cause air mover 406 (which can be located on the same side as first heat-generating component 402) to rotate faster than air mover 408. This can increase the airflow of the electronic device on the side of first heat-generating component 402, thus promoting heat dissipation of first heat-generating component 402. In some cases, although one air mover is rotating faster than another, the speed difference between the impeller can be maintained at about 6-10%, for reasons that will be discussed in more detail below. In other cases, the speed difference can be other than 6-10% as required based upon the differences in temperature and/or activity level of heat-generating components 402 and 404.

Referring to FIGS. 5A-7B, an exemplary air mover assembly is illustrated. The air mover assembly can take the form of a fan assembly 500 that can include a fan housing 502 that carries two air movers. In the particular embodiment shown in the figures, the air movers can include impellers 504 and 506 that are driven by motors. Fan assembly 500 can also include a single exhaust outlet 508 that can be in a trapezoidal shape and multiple inlet openings 510 and 512. Each air mover of fan assembly 500 can receive air from different regions of an electronic device and can form separate airflows. Fan assembly 500 can then merge the separate airflows into a single combined airflow and pass the combined airflow though the single exhaust 508.

Figure 5A:
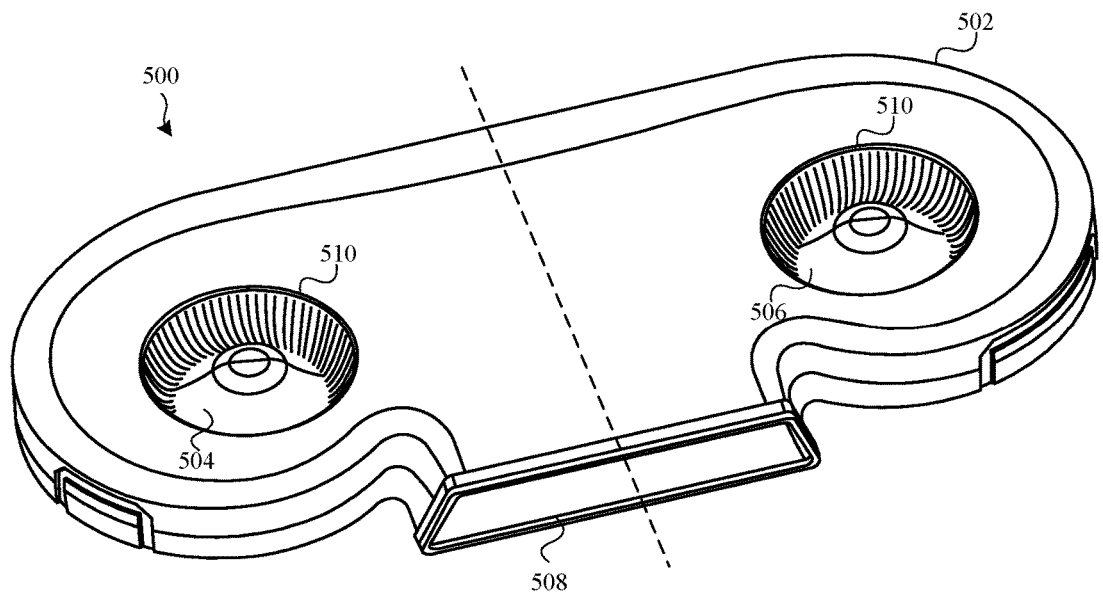
FIGS. 5A and 5B illustrate different perspective views of a fan assembly in accordance with some embodiments.
Figure 5B:
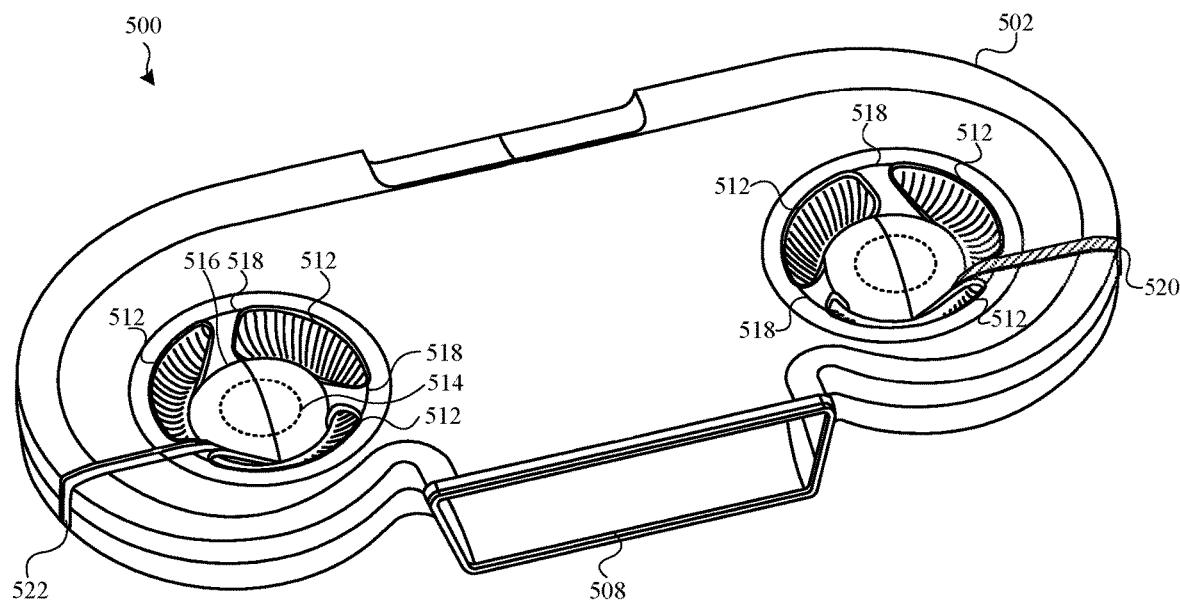
Figure 6A:
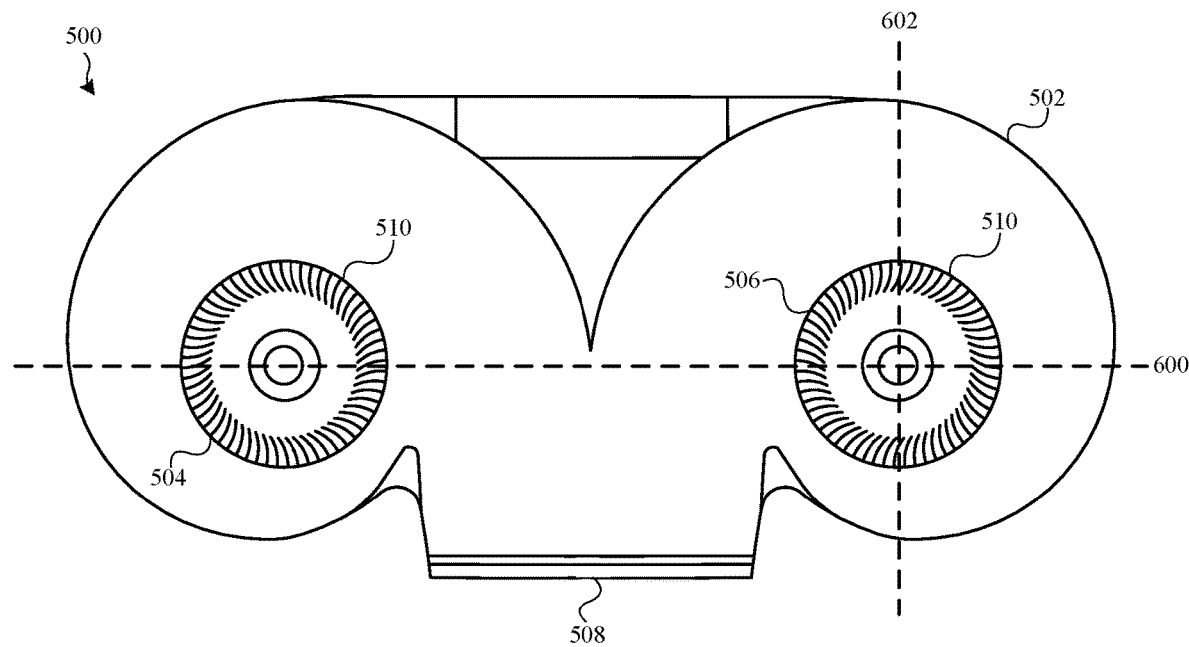
FIGS. 6A and 6B illustrate a first and second surface views of the fan assembly shown in FIGS. 5A and 5B.

At each impeller, there can be a first opening that serves as a primary inlet 510 on the side that is shown in FIGS. 5A and 6A. On the other side of fan assembly 500 shown in FIGS. 5B and 6B, another opening can be present at each impeller. A motor housing 516 can be located at the center of that opening and can be connected to fan housing 502 through multiple struts 518. Since motor housing 516 and struts 518 occupy some space of that opening, the opening is divided into multiple secondary inlets 512. Impellers 504 and 506 can be driven by motors 514 that are located inside motor housing 516. Each motor housing 516 can also include a bearing that supports the impeller.

To control and power a motor 514, a flexible circuit (flex) 520, or another suitable connector and/or cabling arrangement, can connect motor 514 to a control circuit that can include a processor (not shown). For each impeller, a recessed channel 522 can be located along one of the struts 518 and extend through fan housing 502. Flex 520, or other suitable connectors such as wires, can be a thin piece of connector that is located inside channel 522. Flex 520 can generally be flush with the surface of fan housing 502 so that flex 520 does not significantly affect the inlet airflow of fan assembly 500. In FIG. 5B, the flex on the left side is omitted in order to show the recessed channel 522.

In accordance with some embodiments, struts 518 can be shaped, oriented and positioned in certain ways to reduce aero-acoustic noise, aerodynamic losses, and turbulence of fan assembly 500, thus increasing the general heat dissipation efficiency of fan assembly 500. Each strut 518 can have two edges 524 and 526 (labeled in one of the struts 518 at the left impeller shown in FIG. 6B). Described in terms of the direction of airflow, edge 524 can be referred to as forward edge 524 while edge 526 can be referred to as backward edge 526 because the airflow direction is from backward edge 526 to forward edge 524. Backward edges 526 of struts 518 can be tangential to the circumference of circular motor housing 516. As indicated by the arrows 528 (shown in FIG. 6B), air can enter fan housing 502 through an inlet 512 and the air can encounter a strut 518. Instead of being oriented radially (i.e. perpendicular to the circumference of motor housing 516), a strut 518 can be angularly oriented with a tangential component relative to the airflow. This tangential orientation can avoid the air encountering a strut 518 at a significant angle (or perpendicular) so that the air is not forced to make an abrupt turn, which would increase aerodynamic losses and can potentially cause flow separation and create more turbulence. Hence, this tangential orientation can decrease the aerodynamic losses created when air is being drawn into the fan housing 502, thus decreasing aerodynamic resistance and improving aero-acoustic noise of fan assembly 500.

Figure 6B:
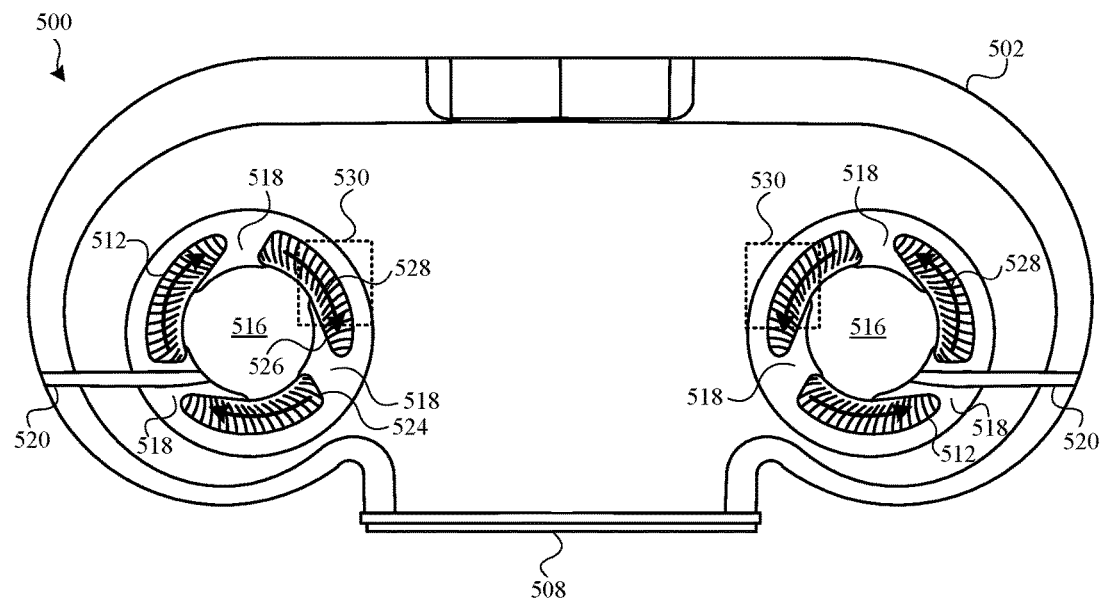
Figure 7A:
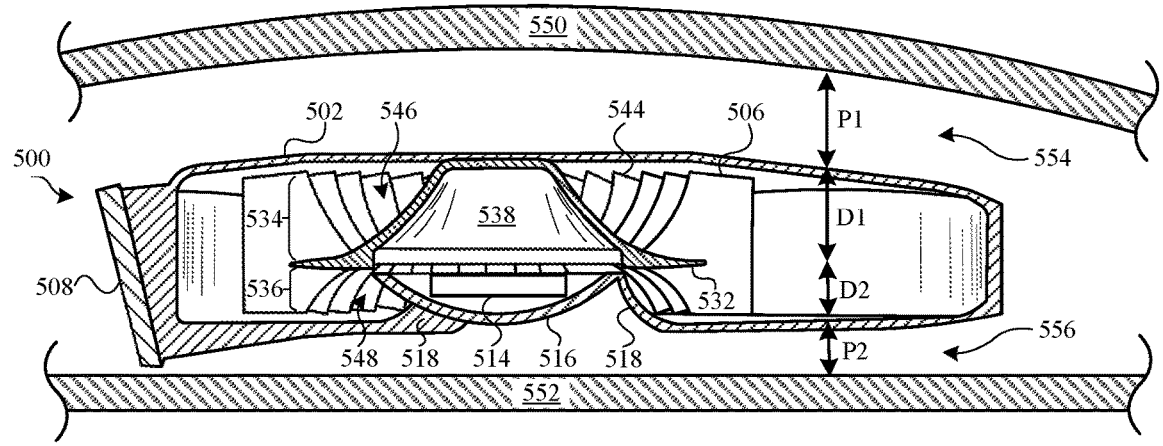
FIG. 7A illustrates a first cross-sectional view of the fan assembly shown in FIG. 6A along the line 602.

In some cases struts 518 are not planar to the surface of fan housing 502. Instead, struts 518 can sink (i.e. sloped inward) into fan housing 502, which is best shown in FIGS. 5B and 7A. The sunken struts 518 can further decrease aerodynamic resistance because the sunken struts 518 can effectively increase the size of opening of secondary inlets 512 by increasing the cross-sectional area of the secondary inlets 512. To illustrate this point, imagine the struts were planar to the surface of fan housing 502. In other words, from the cross-sectional view of FIG. 7A, a planar strut would extend from fan housing 502 to motor housing 516 in a horizontal direction (as contrast to a sunken strut 518 that is also going inward as shown in the figures). As a result, those planar struts would define inlets that would have no depth and have smaller cross-sectional area through which air enters. In contrast, the sunken struts 518 can allow secondary inlets 512 to have a significant larger cross-sectional area that allows air to enter. Put differently, the sunken struts 518 can allow secondary inlets 512 to become three-dimensional because secondary inlets 512 can have opening space from the view of FIG. 6B and also opening space from the view of FIGS. 7A and 7B (cross-sectional). The sunken struts 518 can increase the effective size of secondary inlets 512, improve flow quality, and thus increase the overall aerodynamic efficiency of fan assembly 500.

Figure 7B:
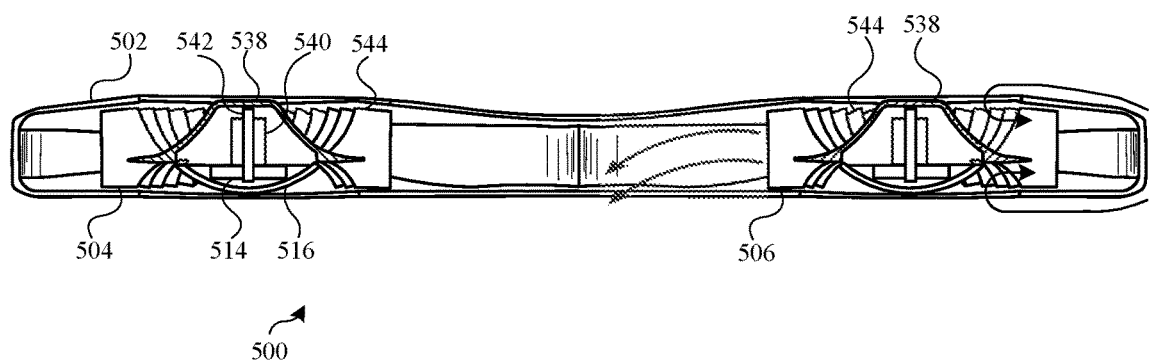
FIG. 7B illustrates a second cross-sectional view of the fan assembly shown in FIG. 6A along the line 600.

FIG. 7B illustrates the airflow direction inside fan assembly 500. In general, after air is drawn into fan housing 502, the air is required to make a 180-degree turn before the air reaches a leading edge of a blade of an impeller. The sunken struts 518 can simplify the flow path of air entering fan housing 502 and provide more space for the airflow to change direction.

In accordance with some embodiments, struts 518 can also be positioned at certain special angular positions relative to the fan housing 502 in order to further increase airflow. The angular positions of struts 518 refer to the clock positions of struts 518 relative to fan housing 502, when viewed from FIG. 6B. For example, in the particular case shown in FIG. 6B, the three struts 518 can roughly be evenly spaced apart at approximately 120-degree separations and be positioned at approximately 0 degrees, 120 degrees, and 240 degrees. However, the three struts can also be located at other angular positions, such as at 60 degrees, 180 degrees, and 300 degrees. The angular positions of the struts 518 can depend on the pressure distribution of the area around secondary inlets 512. The pressure distribution of the area around secondary inlets 512 may not be uniform, meaning some locations of the area can have a higher airflow than other locations. The exact angular positions of struts 518 can be determined based on the pressure distribution of the area around secondary inlets 512 to make sure struts 518 are not blocking any of the high airflow locations. In other words, secondary inlets 512, which are defined by struts 518, can be located at some high airflow areas to increase the efficiency of fan assembly 500. For example, as shown in FIG. 6B, a scroll cut-off region of each impeller is labeled as element 530. Scroll cut-off region 530 can be a high suction region that relatively has a very high airflow. In FIG. 6B, struts 518 can be located at angular positions that avoid scroll cut-off region 530 so that an inlet 512 is located at the same angular position as the scroll cut-off region 530.

It should be noted that while FIG. 6B illustrates one possible exemplary arrangement of struts 518 in terms of their angular positions, those skilled in the art should understand that the angular positions of struts 518 can be determined empirically based on the pressure distribution. Also, there can be any numbers of struts 518 and struts 518 do not have to be spaced apart evenly in the angular direction.

Figure 8:
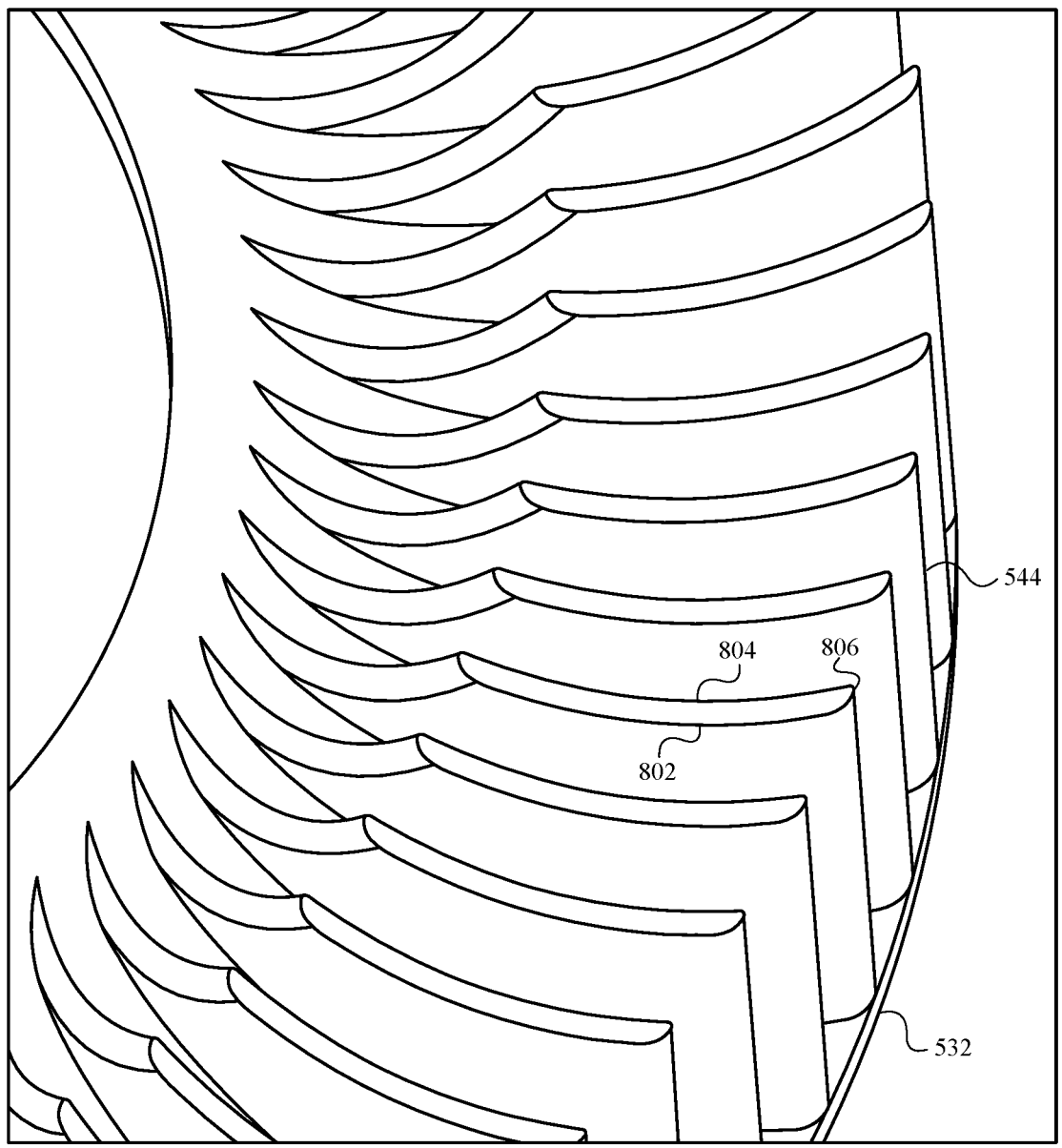
FIG. 8 illustrates a portion of an impeller of a fan assembly in accordance with some embodiments.

Referring to FIGS. 7A, 7B, and 8 and focusing on the impellers 504 and 506, impellers 504 and 506 each can include a sculpted body that increases the aerodynamic efficiency of fan assembly 500. For simplicity, impeller 506 is discussed. Impeller 506 can include an impeller disc 532 that divides impeller 506 into two portions 534 and 536. Portion 534 can be on the side of the primary inlet 510 while portion 536 can be on the side of motor housing 516. In some cases, portions 534 and 536 can be proportionally sized based on the airflow contributions of primary inlet 510 versus the secondary inlets 512. In other words, if more air can be drawn into the fan assembly 500 through primary inlet 510, the size of portion 534 can be relatively larger than the size of portion 536, or vice versa. Impeller 506 can include an impeller hub 538 that carries rotational components such as a shaft 542 and a bearing 540 that is connected to motor 514 in the motor housing 516. Impeller hub 538 can have a curved surface that is shaped to reduce resistance against airflow, thereby reducing entrance losses. Impeller disc 532 can carry multiple blades 544 that are positioned relatively vertically. The inner side of each blade 544 can have a somewhat hyperboloid shape in which blade 544 progressively encroach towards the center of rotation of impeller disc 532. Put differently, at both portions 534 and 536, each blade 544 has the largest chord length at a vertical level near impeller disc 532 then gradually tapers to a smaller chord length away from the center of the impeller 506 in a concave manner at the leading edge. Together with impeller hub 538, parts of blades 544 in portion 534 can define a well 546 that is recessed from the surface of fan housing 502. Well 546 can be in a half-torus shape. Similarly, together with motor housing 516, parts of blades 544 in portion 536 can define a well 548 that is recessed from the opposite surface of fan housing 502. Well 548 can also be in a half-torus shape. Well 546 and well 548 can be associated with the volumes of air that are drawn into fan housing 502. The larger the well 546, the more air can be drawn into fan housing 502 from the side of primary inlet 510.

In some embodiments, the depth of well 546 relative to the depth of well 548 can be in a specific ratio to maximize the aerodynamic efficiency of fan assembly 500. In FIG. 7A, the depth of well 546 is labeled as D1 while the depth of well 548 is labeled as D2. The ratio of D1 to D2 can be associated with the ratio of airflow in portion 534 to airflow in portion 536. D1 and D2 can depend on the shape of impeller 506 such as the relative position of impeller disc 532. For example, if the impeller disc 532 is positioned more towards primary inlet 510, D1 will decrease while D2 will increase. According to some embodiments, the ratio of D1 to D2 can be associated with the spaces external to fan assembly 500. In FIG. 7A, enclosures of an electronic device are shown. For example, element 550 can be the housing 106 while element 552 can be the backside of display portion 102. The space between fan assembly 500 and a housing can be called plenum. First plenum 554 can be the space at a first surface of fan assembly 500 and between fan assembly 500 and element 550 while second plenum 556 can be the space at a second surface of fan assembly 500 and between fan assembly 500 and element 552. The first height of first plenum 554 is labeled as P1 while the second height of second plenum 556 is labeled as P2. The ratio of D1 to D2 can correspond to the ratio of P1 to P2. In one case, both ratios can be 2:1. In other words, since the space of first plenum 554 can be larger than the space of second plenum 556, more air can flow through first plenum 554. Consequently, impeller 506 can also be shaped such that well 546 is deeper than well 548. As such, the primary inlet 510 side of impeller 506 can have higher capacity to drive more airflow through fan assembly 500. In some cases, the ratio of D1 to D2 can also be based on the ratio of the airflow at portion 314 to the airflow at portion 312 in FIG. 3.

FIG. 8 illustrates the shape of blades 544 of impeller 506 in accordance with some embodiments. The suction side 802 and pressure side 804 can form a thin and sharp blade. The blade can have a sharp trailing edge 806 instead of a rounded edge. The shape of the blades 544 can improve aerodynamic performance of the impeller by preventing leakage of high-pressure airflow from pressure side 804 of the blade to suction side 802 of the blade, at the trailing edge 806.

Figure 9A:
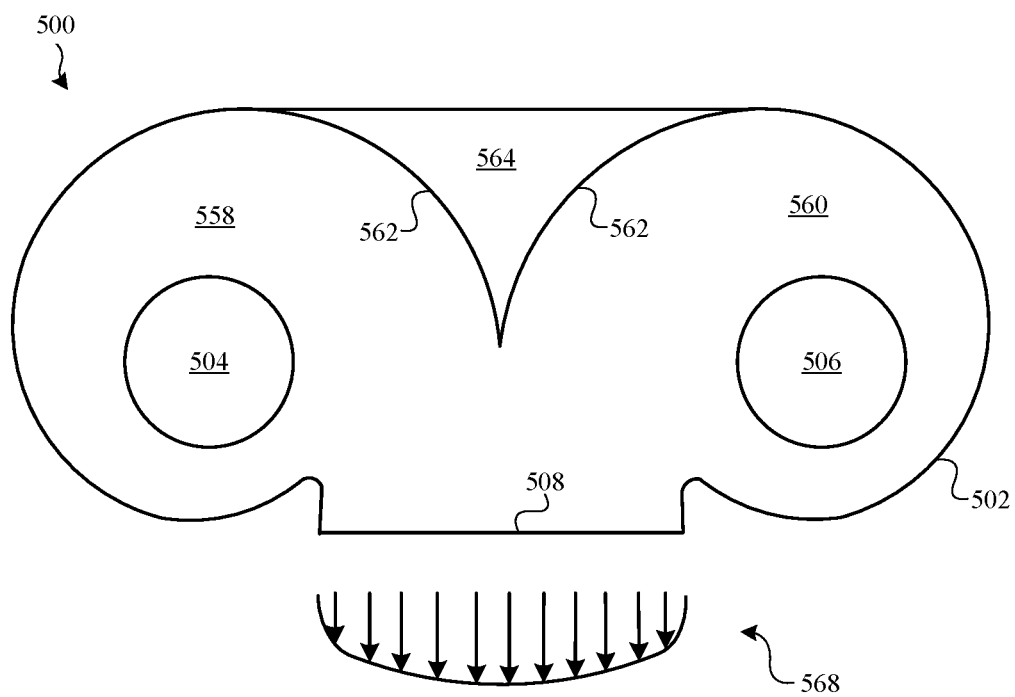
FIGS. 9A and 9B illustrate different flow distribution profiles of fan assemblies in relation to different scroll wall designs.
Figure 9B:
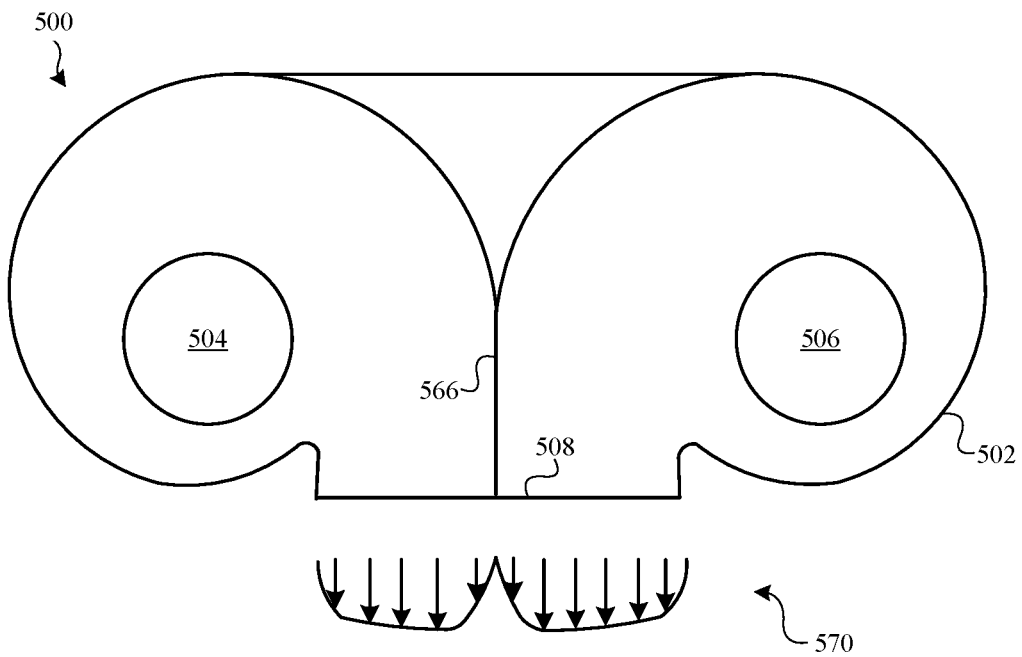

Referring to FIGS. 5A, 9A and 9B and focusing on fan housing 502, fan assembly 500 can include two scroll portions 558 and 560. Scroll portions 558 and 560 can be arranged symmetrically along a dashed midline shown in FIG. 5A. Scroll portions 558 and 560 can have scroll wall 562 that defines the flow path of air inside fan housing 502. Scroll wall 562 can block area 564, which can be in a triangular shape with two inwardly curved sides. Without scroll wall 562 at area 564, air expelled from impeller 504 and air expelled from impeller 506 can encounter each other at opposite direction, which can create turbulence. Scroll wall 562 at area 564 can allow air to turn smoothly into the direction of the exhaust 508 while building up air pressure through the scroll, thus promoting less turbulent airflow with higher pressure. From the position where the streams of air from both impellers 504 and 506 turn into a similar or same direction, the scroll wall that become part of an interior wall can be truncated to allow two streams of air to merge and settle before exiting exhaust 508. Therefore, the scroll wall can be truncated at a location between the exhaust 508 and a point where the scroll wall first becomes generally perpendicular to the exhaust 508. Described differently, a portion of interior wall of the fan housing along a portion of the midline of the fan assembly can be truncated such that air from both scroll portion 558 and 560 can merge before the exhaust 508.

FIGS. 9A and 9B illustrate the improvement of flow distribution when scroll wall 562 is truncated. FIG. 9A shows a truncated scroll wall 562 and FIG. 9B shows a scroll wall that continues through the exhaust 508. The un-truncated part of scroll wall in FIG. 9B is labeled as element 566. The flow distribution profile in FIG. 9A is labeled as element 568 while the flow distribution profile in FIG. 9B is labeled as element 570. As shown in FIG. 9A, the truncated scroll wall 562 can allow a more uniform flow distribution 568. On the contrary, the un-truncated part 566 of scroll wall in FIG. 9B creates a velocity deficit region at the exhaust 508 as shown in flow distribution profile 570. The more uniform flow distribution 568 represents a combined airflow from both scroll portions that can be characterized as being generally less turbulent in nature. This uniform flow distribution 568 can reduce the shear (velocity gradient) in the outgoing airflow, which generally will result in less aero-acoustic noise and less turbulence.

In some embodiments, although impellers 504 and 506 can be a same type of impeller with similar or same size and shape, there can be a speed differential between impellers 504 and 506. In some cases, the speeds of rotation of the two impellers 504 and 506 can maintain a non-zero speed differential of about 6% to 10% (e.g. one rotating at a speed of +4% from a reference level and another rotating at a speed of −4% from the reference level). The speed differential can be maintained at any speed levels. For example, both impellers 504 and 506 can have variable speeds depending on the temperature of the electronic device and/or other heat dissipation need, but a speed differential can be maintained across different speeds. The speed differential can improve the aero-acoustic noise and improve the sound quality of fan assembly 500. When both impellers 504 and 506 are operating at a same speed, the frequency of the impeller blades and the motors driving both impellers 504 and 506 may modulate and may excite fan housing 502, creating loud noise. By spacing out the frequencies, such type of modulation can be avoided. Also, both impellers 504 and 506 are discharging into a same pressurized area near exhaust 508, impellers 504 and 506 can surge periodically under unusual high back pressure, resulting, for example, from severe blockage of the output vents if the speeds of both impellers are elevated and the target speeds of both impellers are the same. This can create some undesirable oscillation. Spacing out the speeds of impellers 504 and 506 slightly can avoid causing the impellers to surge periodically.

In some cases, one of the impellers 504 and 506 can always rotate faster than another impeller. For example, if a first heat-generating component has a higher heat generation than the second heat-generating component, the impeller on the side of the heat-generating component can be configured to rotate faster than the impeller on the side of the second heat-generating component. In one particular case, the component with a higher heat generation can be the GPU of the electronic device when compared to the CPU. In other cases, which impeller rotates faster can be adaptive based on the temperatures of the heat-generating components.

Figure 10:
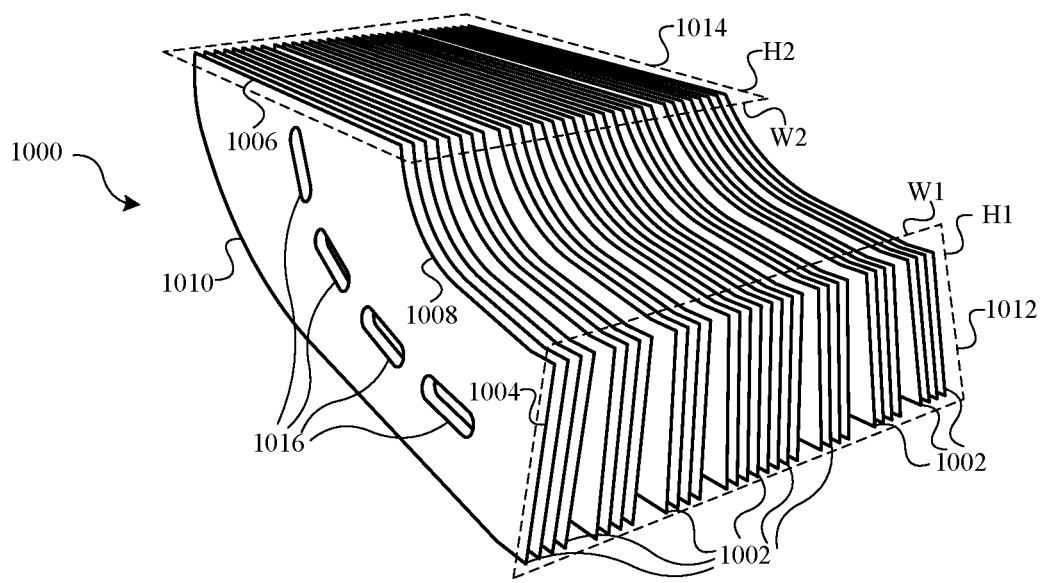
FIG. 10 illustrates a perspective view of a heat exchanger in accordance with some embodiments.
Figure 11:
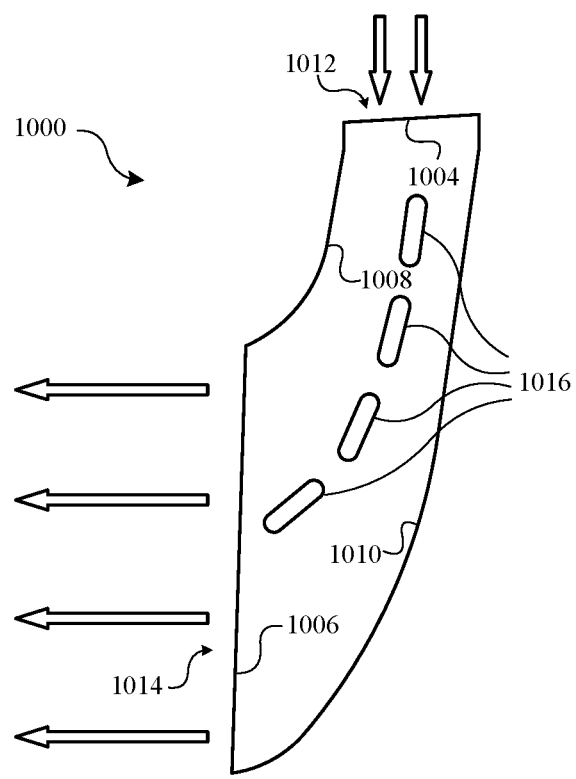
FIG. 11 illustrates a side view of the heat exchanger shown in FIG. 10.

Referring to FIGS. 10 and 11, a heat exchanger 1000 in accordance with some embodiments is shown. FIG. 10 is a perspective view of heat exchanger 1000 and FIG. 11 is a side view of heat exchanger 1000. Heat exchanger 1000 can be used as the heat exchanger 304 shown in FIGS. 3 and 4. Heat exchanger 1000 can include multiple cooling fins 1002 that can be made from metal sheets or other suitable thermal conductive materials. The cooling fins 1002 can be attached together by any suitable mechanical fastening or attachment mechanisms including zipper, adhesive, and/or welding. Each cooling fin 1002 can have a similar shape so that the cooling fins 1002 can stack together to form a finstack.

In one exemplary shape, each cooling fin 1002 can be characterized as having a first side edge 1004, a second side edge 1006, a inner curved edge 1008 and an outer curved edge 1010 that cooperate to define a surface having a J-shape. First side edge 1004 and second side edge 1006 can be straight edges and can be opposite. In other words, first side edge 1004 and second side edge 1006 can be non-adjacent to each other so that they do not meet. Inner curved edge 1008 and outer curved edge 1010 can be curved edges that are opposite. First side edge 1004 and second side edge 1006 can be adjacent to inner curved edge 1008 and outer curved edge 1010. Cooling fins 1002 can be stacked together such that the first side edges 1004 of cooling fins 1002 can cooperate to define an inlet 1012 (labeled by a dashed box) and the second side edges 1006 can cooperate to define an exhaust 1014 (labeled by another dashed box). First side edges 1004 can be non-parallel to second side edges 1006 such that an airflow path of heat exchanger 1000 can turn radially from inlet 1012 to exhaust 1014.

In general, inlet 1012 can be coupled to an exhaust of a fan assembly while exhaust 1014 can be coupled to outlet vents of the main housing of an electronic device. Heat exchanger 1000 can have a curved body that turns the airflow radially from inlet 1012 to exhaust 1014. Hence, air expelled from a fan assembly can undergo further heat exchange when the air flows though heat exchanger 1000. Heat exchanger 1000 can include multiple slots 1016 for insertions of heat pipes that carry heat conductively from heat-generating components such as processors. It should be noted that each cooling fin 1002 can include those slots 1016 so that heat pipes can be inserted all the way through heat exchanger 1000. When the heat carried from the heat pipes reaches heat exchanger 1000, the air flowing thought heat exchanger 1000 can transfer heat from the heat pipes and carry the heat away from the electronic device.

Heat exchanger 1000 in accordance with some embodiments can work well with other component described herein. Other components in electronic device 100 may create restriction to a heat exchanger, which can best be explained by referring back to FIGS. 3 and 4A. An effective heat exchanger for electronic device 100 is required to address the heat dissipation need of electronic device 100 while being able to fit the form factor of a housing 106 that can sometimes have a convex shape. To increase the capacity of fan assembly 302, the size of the exhaust of fan assembly 302 is required to increase. However, to fit into a relative thin internal volume 300, the height of the exhaust (which is along x-direction when fan assembly 302 is oriented as shown in FIG. 3) can be limited by the form factor of housing 106. Hence, to increase the capacity of fan assembly 302, the width of the exhaust needs to be widened. For example, if fan assembly 500 is used as fan assembly 302, fan assembly 500 has a relatively wide exhaust because of the double impeller design. On the other hand, the width of outlet vents 206 can be limited by the width of stand 108 because output vents 206 should be hidden behind stand 108. Hence, to increase the capacity of outlet vents 206, the height of outlet vents 206 can be increased. Also, the area size of outlet vents 206 should be larger than the area size of the exhaust of fan assembly 302 to promote the airflow. In addition, a heat exchanger for electronic device 100 can be positioned near the center of electronic device 100, where a hinge portion 320 is located.

Referring to FIGS. 10 and 11, heat exchanger 1000 can be an exemplary heat exchanger that effectively addresses the heat dissipation need for electronic device 100. Inlet 1012 of heat exchanger 1000 can be wide so that heat exchanger 1000 can be used with a fan assembly that has a wide exhaust. Exhaust 1014 of heat exchanger 1000 can be narrower than inlet 1012 but taller than inlet 1012. In other words, trapezoidal inlet 1012 can have a first base width W1 (the narrower base of the trapezoid) and a first height H1, while rectangular exhaust 1014 can have a second width W2 that is smaller than the first base width W1 and a second height H2 that is larger than the first height H1. Exhaust 1014 can have a rectangular shape that is close to a square. Hence, exhaust 1014 can match output vents 206 that are hidden behind stand 108. In some embodiments, the area ratio of inlet 1012 to exhaust 1014 can be between 1:2 and 1:3. Having exhaust 1014 being larger than inlet 1012 can promote airflow from inlet 1012 to exhaust 1014. As shown in the side view FIG. 11, the cooling fins 1002 of heat exchanger 1000 can generally be curved and in a J-shape so that airflow can smoothly make a 90-degree turn radially or an almost 90-degree turn radially. The smooth turn of airflow and transition from a smaller inlet 1012 to a larger exhaust 1014 can reduce turbulence in heat exchanger 1000. In addition, slots 1016 can be flattened so that the heat pipes that are inserted into heat exchanger 1000 do not impede the airflow. Also, slots 1016 can be aligned along a curve of airflow path to further reduce the interference of airflow. Hence, the orientations of slots 1016 gradually turn from the direction of airflow at inlet 1012 to the direction of airflow at exhaust 1014.

Figure 12:
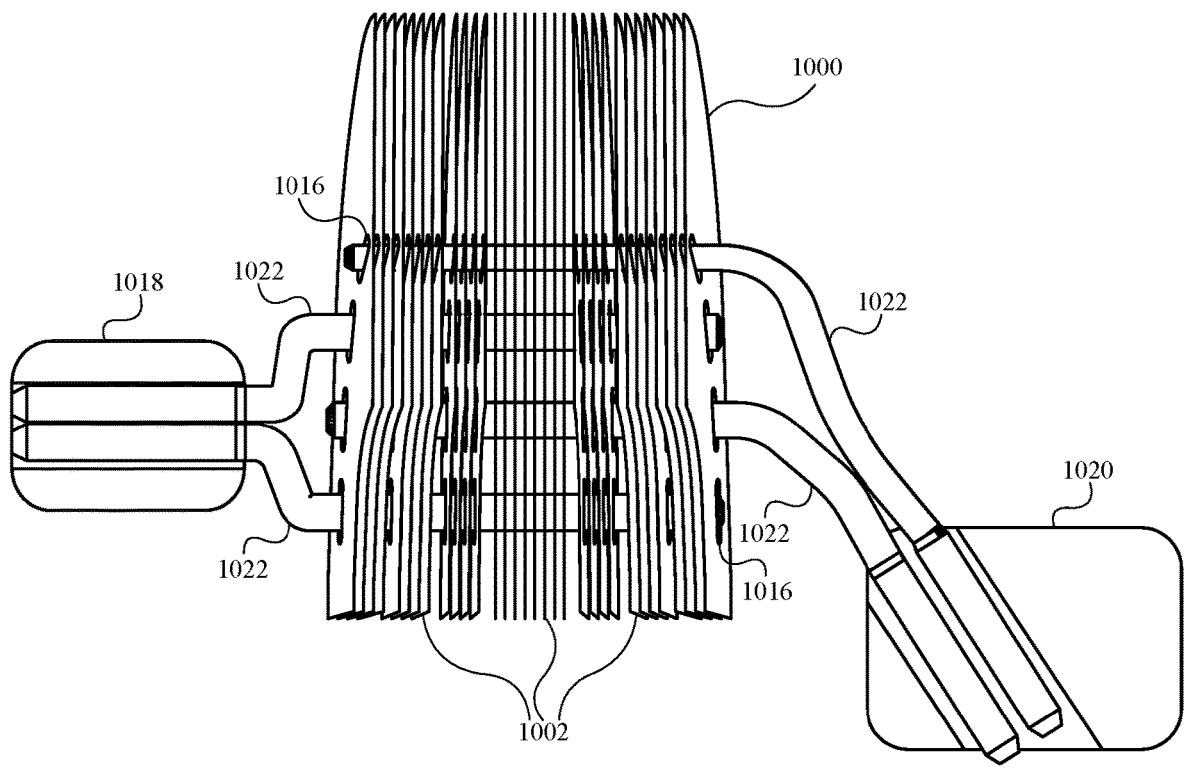
FIG. 12 illustrates a heat exchanger connecting to two heat-generating components via heat pipes in accordance with some embodiments.

Referring to FIG. 12, heat exchanger 1000 can be coupled to one or more heat-generating components through multiple heat pipes. In the particular configuration shown in FIG. 12, heat exchanger 1000 can be coupled to a first processor 1018 on one side of heat exchanger 1000 and coupled to a second processor 1020 on an opposite side of heat exchanger 1000. Having two processors 1018 and 1020 positioned in opposite sides can allow more uniform heat distribution within an internal volume of an electronic device and allow a better heat management through the double impeller fan assembly 500 as illustrated in FIG. 4B. Each processor 1018 or 1020 can be connected to heat exchanger 1000 through two heat pipes 1022. Heat pipes 1022 can include a heat transfer medium such as a sealed pipe containing heat-exchanging fluid therein. To increase the heat exchange capacity of a heat pipe, the size of the heat pipe can be increased. However, as the diameter or the height of the heat pipe increases, the heat pipe can interfere with the airflow of heat exchanger 1000. Hence, in accordance to some embodiments, two flattened heat pipes 1022 having low profile cross sections are used for connecting a heat-generating component to heat exchanger 1000. Increasing the number of heat pipes 1022 for each heat-generating component can increase the heat exchange capacity of the heat pipes without sacrificing the low turbulent airflow of heat exchanger 1000.

In addition, having two or more heat pipes for each heat-generating component can promote more even heat dissipation among the heat-generating components. If first processor 1018 and second processor 1020 are each connected to heat exchanger 1000 only through a single heat pipe, the heat pipe of either one of the processors will be positioned upstream of another heat pipe in heat exchanger 1000. Upstream here refers to the direction of airflow in heat exchanger 1000 that is flowing from inlet 1012 (more upstream) to exhaust 1014 (more downstream). Having one heat pipe always upstream of another heat pipe means that the processor that is connected to the more upstream heat pipe will usually get a better cooling compared to the other processor because the air is usually cooler in the upstream. In contrast, as shown in the configuration of FIG. 12, first processor 1018 and second processor 1020 can each be connected to two heat pipes 1022. Those heat pipes 1022 can be interleaved heat pipes that are connected to heat exchanger 1000 in an alternating order. In other words, from upstream to downstream, a first set of heat pipes that include the first and third heat pipes 1022 can be thermal conductively connected to first processor 1018 while a second set of heat pipes that include the second and fourth heat pipes 1022 can be thermal conductively connected to second processor 1020. Because the set of heat pipes for first processor 1018 and the set of heat pipes for second processor 1020 are interleaved, a difference in the capability of heat transfer from the first and second processors 1018 and 1020 is minimized.

Figure 13A:
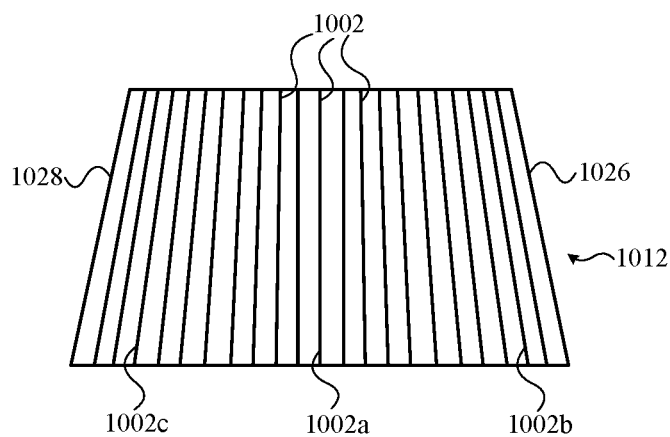
FIGS. 13A and 13B illustrate cross-sectional views of inlets of heat exchangers in accordance with some embodiments.
Figure 13B:
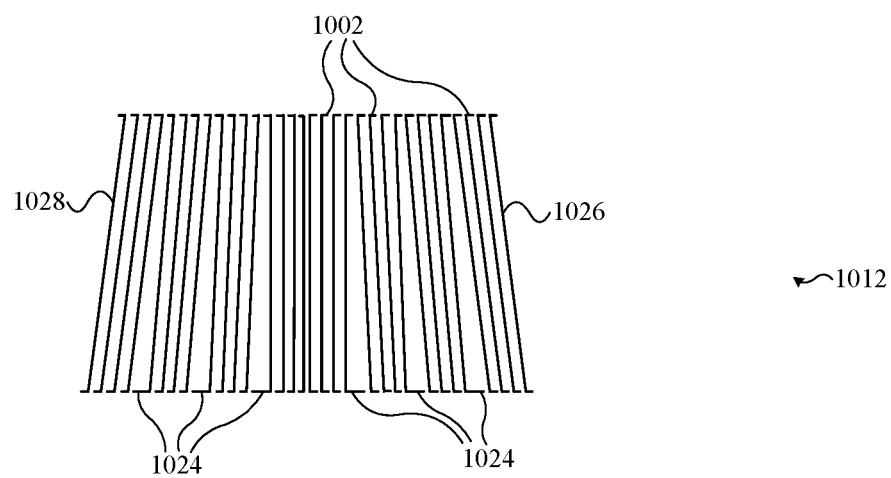

Referring to FIGS. 13A and 13B, cross-sectional views of inlets 1012 of heat exchanger 1000 in accordance with different embodiments are shown. It should be noted that inlet 1012 can be in a trapezoidal shape to allow heat exchanger 1000 to smoothly transition from a wider but shorter inlet (such as inlet 1012 shown in FIGS. 10 and 11, above) to a narrower but taller exhaust (such as exhaust 1014 shown in FIGS. 10 and 11, above). More particularly, as illustrated in FIG. 13A, heat exchanger 1000 can have cooling fins 1002 that form individual trapezoids that, when combined, allow a transition from the inlet to the exhaust in accordance with an embodiment. For example, a middle fin 1002a can be generally perpendicular to the parallel edges (i.e. the top and the base) of the inlet 1012, whereas other cooling fins such as 1002b and 1002c can be gradually tapered towards the two legs 1026 and 1028 of trapezoidal inlet 1012. In other words, a middle fin can be generally perpendicular to a base of trapezoidal inlet 1012; a first group of fins can be gradually tapered towards a first leg 1026; and a second group of fins can be gradually tapered towards a second leg 1028.

FIG. 13B illustrates another exemplary cross-sectional view of inlet 1012 in accordance with an embodiment. Cooling fins 1002 can be divided in groups of fins that are parallel. In one case, each group can include four cooling fins 1002, although the exact number of cooling fins 1002 in each group can vary. The cooling fins 1002 in each group can have the same orientation while the cooling fins 1002 among different groups can have different orientations. For example, two middle groups of cooling fins 1002 can be generally perpendicular to the parallel edges of the trapezoid. Other groups can be gradually tapered towards the two legs 1026 and 1028 of the trapezoid. Each group of cooling fins 1002 can include a transition fin 1024 positioned between groups of cooling fins 1002. The transition fins 1024 can facilitate the arrangement of the groups of cooling fins 1002 such that the groups can become gradually tapered towards the two legs 1026 and 1028 of the trapezoidal inlet 1012. The transition fins 1024 can allow the groups of cooling fins 1002 to be aligned more easily. Grouping the cooling fins 1002 can allow easier assembly of heat exchanger 1000 as fins can be manufactured in groups and then the groups can be attached together by any suitable fastening or attachment mechanisms afterward. In some embodiments, each of the cooling fins 1002 and/or transition fins 1024 include features that help facilitate proper spacing between groups of fins. Each cooling fin 1002 includes features of equal length proximate the parallel edges of the trapezoid to facilitate a parallel arrangement with an adjacent fin. In contrast, each transition fin 1024 includes features of different lengths proximate the parallel edges of the trapezoid to facilitate a non-parallel arrangement of a group of cooling fins 1002 with an adjacent group of cooling fins 1002. In some embodiments, the features are bent edges of the cooling fins 1002 and transition fins 1024.

Figure 14:
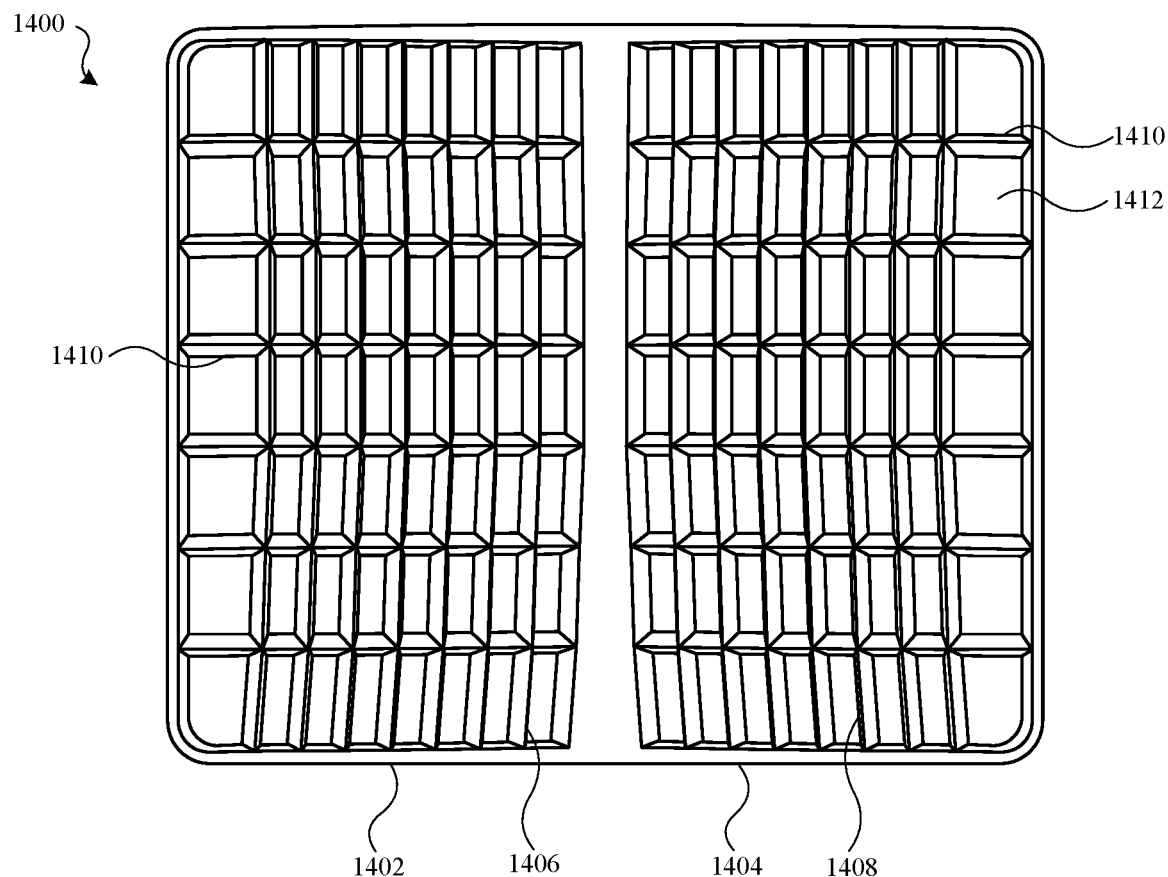
FIG. 14 illustrates an insulating box in accordance with some embodiments.

FIG. 14 illustrates an insulating box 1400 in accordance with some embodiments. Insulating box 1400 can be formed from a polymer material and can be positioned between the exhaust of a heat exchanger and the outlet vents of an electronic device. For example, insulating box 1400 can be an exemplary insulating box 212 shown in FIG. 3 that is positioned between heat exchanger 304 and outlet vents 206.

As shown in FIG. 14, insulating box 1400 can include a first side portion 1402 and a second side portion 1404. The side portions can also be referred to as a left portion and a right portion, but it should be understood that insulating box 1400 can also be divided into any other suitable divisions such as top and bottom, specific quadrants, or other identifiable, symmetrical or not, regions. Side portions 1402 and 1404 can have multiple vertical and horizontal strips 1406, 1408, and 1410 that cooperate to form grids. When insulating box 1400 is mounted on housing 106 of electronic device 100, first side portion 1402 can be located on the left (viewed from the back of the electronic device) side of outlet vents 206 while second side portion 1404 can located be on the right side of outlet vents 206. The vertical strips 1406 of first side portion 1402 can be oriented towards a first sideway direction while the vertical strips 1408 of second side portion 1404 can be oriented towards a second sideway direction opposite the first sideway direction. For example, in one case the first sideway direction can be towards the left and the second sideway direction can be towards the right. Vertical and horizontal strips 1406, 1408, and 1410 can each have aerodynamically contoured edges so that airflow meeting a strip can be driven according to the shape and orientation of the strip. The gird formed by the vertical and horizontal strips 1406, 1408, and 1410 can include multiple openings 1412 that allow heated air to pass through insulating box 1400.

Figure 15:
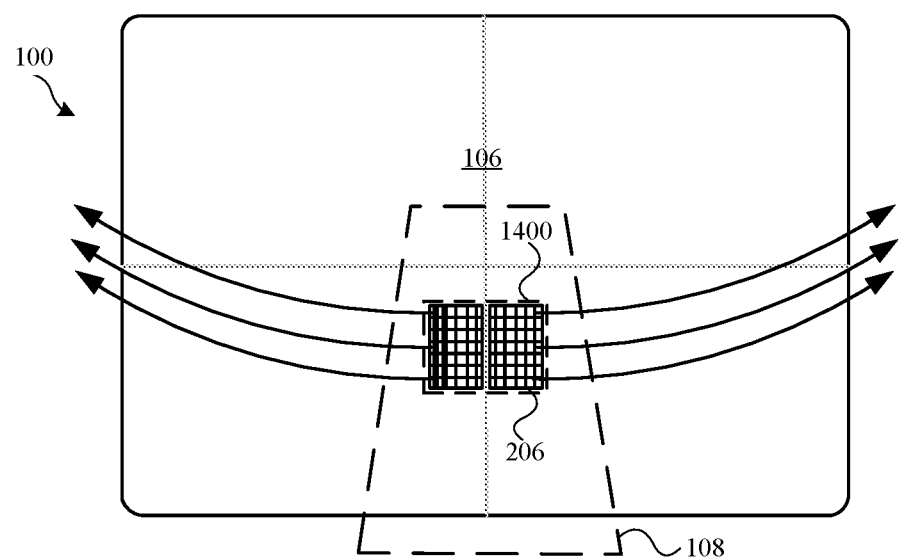
FIG. 15 illustrates a rear view of the outgoing airflow of an electronic device with the insulating box shown in FIG. 14.

The insulating box 1400 can serve multiple purposes. First, insulating box 1400 can provide thermal insulation to the back of housing 106 of electronic device 100 to reduce the temperature of the housing 106 near the area of output vents 206. As shown in FIG. 15, insulating box 1400 (represented by a dashed box) is located at the area of output vents 206 of housing 106 of electronic device 100. The area of output vents 206 can be one of the hottest areas of housing 106 because heated air from a heat exchanger passes through that area to exit housing 106. In some embodiments, the strips of insulating box 1400 can be aligned with the grills of housing 106 that define the output vents 206. In other words, the insulating box 1400 can largely cover the interior part of housing 106 at the area of output vents 206. Since insulating box 1400 can be formed from a polymer material, the covering of housing 106 by insulating box 1400 can provide thermal insulation of housing 106 from the heated air that passes through outlet vents 206.

Also, the insulating box 1400 can direct air to exit electronic device 100 at certain preferred angles so that the air circulation and heat dissipation of electronic device 100 can be improved. Vertical strips 1406 on the first portion 1402 can point in a first direction while vertical strips 1408 on the second portion 1404 can point in a second direction opposite the first direction. Hence, the vertical strips can contour air exiting housing 106 sideway (instead exiting housing 106 straight), as shown in the arrows in FIG. 15. Since outlet vents 206 can be positioned behind stand 108, the splitting of the outgoing airflow into two or more directions can avoid at least portion of the airflow impinging on stand 108. Hence, insulating box 1400 can promote heat dissipating and air circulation of electronic device 100 because at least majority of the heated air will not hit the stand 108, then reflect and/or accumulate at the area between 106 housing and stand 108.

Figure 16:
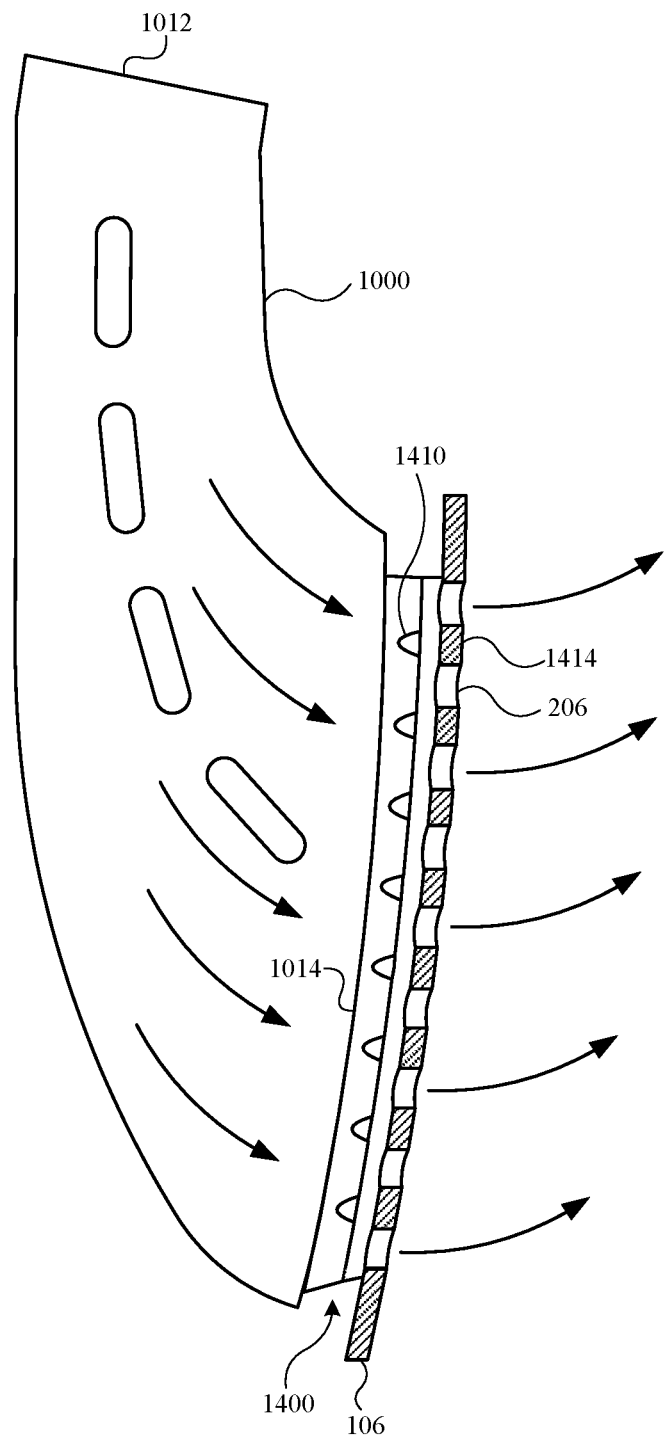
FIG. 16 illustrates a cross-section view of the insulating box in position with a heat exchanger and a part of housing of an electronic device in accordance with some embodiments.

Referring to FIG. 16, a cross-sectional view of insulating box 1400 mounted on housing 106 is shown. Insulating box 1400 can be connected to the exhaust 1014 of heat exchanger 1000. FIG. 16 shows that the horizontal strips 1410 of insulating box 1400 can be in a triangular shape with the vertex of the triangle pointing towards exhaust 1014 of heat exchanger 1000 and the base of the triangle aligned with the horizontal grills 1414 of housing 106. The triangular horizontal strips 1410 can prevent air from impinging on horizontal grills 1414 of housing 106. The impingement of air onto horizontal grills 1414 can create turbulence as the air hitting grills 1414 can be reflected back towards the exhaust 1014. Triangular horizontal strips 1410 can also contour air to exit housing 106 in a horizontal or some slightly upward directions. As shown in FIG. 16, the airflow coming out from exhaust 1014 can have a direction with a downward component. If triangular horizontal strips 1410 are not present, heated air can exit housing 106 at a downward direction and can be re-circulated back into housing 106 by intermingling with air entering inlet vents 202 that are located below outlet vents 206 (shown in FIGS. 3 and 4). Triangular horizontal strips 1410 can change the exit directions of the air to promote better heat circulation and to prevent heated air from re-entering the housing 106.

Figure 17:
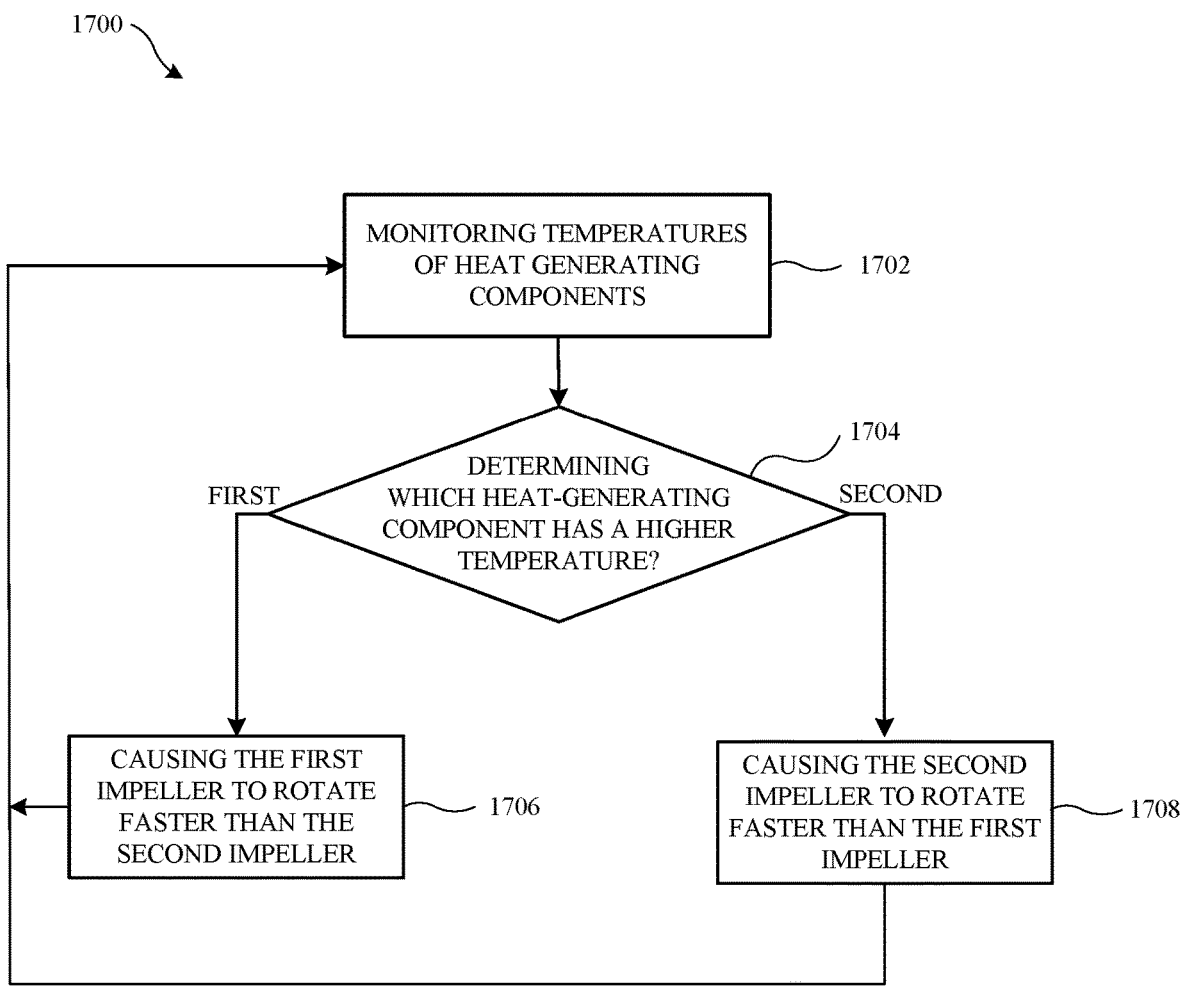
FIG. 17 illustrates a flowchart depicting a process to regulate the speeds of impellers of a fan assembly in accordance with some embodiments.

FIG. 17 illustrates a flow chart of an exemplary process 1700 for regulating rotational speeds of two impellers in a double impeller fan assembly in accordance with some embodiments. A processor, which can be the CPU of an electronic device or a dedicated processor, can control and regulate the speeds of the two impellers. The electronic device can have two major heat-generating components. The first heat-generating component can be located on a first side of the electronic device and the second heat-generating component can be located on a second side of the electronic device. The first impeller of the fan assembly can also be located on the first side and the second impeller of the fan assembly can be located on the second side. Process 1700 can begin at step 1702, where the temperatures of both the first heat-generating component and the second heat-generating component can be monitored. At decision stage 1704, the processor can determine whether the first heat-generating component or second heat-generating component has a higher temperature and whether the temperature difference is greater than a predetermined threshold value. If the temperature of the first heat-generating component is higher than that of the second heat-generating component by the threshold value, at step 1706 the processor can cause the first impeller to rotate faster than the second impeller, thereby forming a relative speed relationship between the first and second impellers. If the temperature of the second heat-generating component is higher than that of the first heat-generating component by the threshold value, at step 1708 the processor can reverse the relative speed relationship by causing the second impeller to rotate faster than the first impeller. In some cases, the relative speed relationship can be limited to a maximum speed difference of less than 15%. In other cases, the speed differential can be more than 15% when the temperature difference between the heat-generating components is large. Also, in some cases, when the difference in temperatures between the first and second heat-generating components is less than the threshold value, the current relative speed relationship can be maintained, meaning that a faster impeller can continue to rotate faster than the other impeller. However, in some cases the threshold value can be set at zero, meaning that the relative speed relationship can be reserved whenever a temperature difference is detected. Process 1700 can be continuously repeated. The temperatures of both components can continue to be monitored and the relative speed relationship of the impellers can adaptively be adjusted based on the temperatures.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data that can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device, comprising:
    a housing that defines an internal volume and outlet vents leading to the internal volume, the housing further comprising a first region and a second region separate from the first region;
    an air mover assembly located in the internal volume, the air mover assembly comprising an exhaust outlet;
    a first heat-generating component located in the first region;
    a second heat-generating component located in the second region; and
    a heat exchanger capable of receiving an airflow from the exhaust outlet and passing the air out of the housing, the heat exchanger thermally connected to the first heat-generating component and the second heat-generating component, the heat exchanger comprising:
        a first set of heat pipes arranged to transfer heat from the first heat-generating component; and
        a second set of heat pipes arranged to transfer heat from the second heat-generating component, wherein the first set of heat pipes is interleaved with the second set of heat pipes; and
    an insulating box located in the internal volume between an exhaust of the heat exchanger and the outlet vents.

2. The electronic device as recited in claim 1, wherein the heat exchanger comprises fins stacked together to form a finstack.

3. The electronic device as recited in claim 1, wherein the heat exchanger turns the airflow radially from an inlet of the heat exchanger to an exhaust of the heat exchanger.

4. The electronic device as recited in claim 1, wherein the insulating box including strips that define a grid.

5. The electronic device as recited in claim 4, further comprising a stand that is rotationally coupled to the housing, wherein the outlet vents are covered by the stand, and wherein the insulating box is configured to contour air to exit the electronic device to avoid the stand.

6. The electronic device as recited in claim 4, wherein the strips have triangular cross sections so that the insulating box is configured to contour air to exit the housing in a direction away from incoming air.

7. The electronic device as recited in claim 1, wherein the air mover assembly comprises:
    a first air mover operable to move air from the first region towards the exhaust outlet; and
    a second air mover operable to move air from the second region towards the exhaust outlet, and wherein when the air mover assembly is operating, the first air mover and the second air mover maintain a non-zero speed differential that is less than 15%.

8. The electronic device as recited in claim 1, wherein the exhaust outlet defines a single exhaust outlet.

9. An electronic device, comprising:
    a housing that defines an internal volume and outlet vents leading to the internal volume, the housing further comprising a first region and a second region separate from the first region;
    an air mover assembly located in the internal volume, the air mover assembly comprising an exhaust outlet,
    a first heat-generating component located in the first region;
    a second heat-generating component located in the second region; and
    a heat exchanger capable of receiving an airflow from the exhaust outlet and passing the air out of the housing, the heat exchanger thermally connected to the first heat-generating component and the second heat-generating component; and an insulating box located in the internal volume between an exhaust of the heat exchanger and the outlet vents, wherein the insulating box including strips that define a grid.

10. The electronic device as recited in claim 9, wherein the heat exchanger comprises:
   a first set of heat pipes arranged to transfer heat from the first heat-generating component; and
   a second set of heat pipes arranged to transfer heat from the second heat-generating component, wherein the first set of heat pipes is interleaved with the second set of heat pipes.

11. The electronic device as recited in claim 9, wherein the heat exchanger comprises fins stacked together to form a finstack.

12. The electronic device as recited in claim 9, wherein the heat exchanger turns the airflow radially from an inlet of the heat exchanger to an exhaust of the heat exchanger.

13. The electronic device as recited in claim 9, further comprising a stand that is rotationally coupled to the housing, wherein the outlet vents are covered by the stand, and wherein the insulating box is configured to contour air to exit the electronic device to avoid the stand.

14. The electronic device as recited in claim 9, wherein the strips have triangular cross sections so that the insulating box is configured to contour air to exit the housing in a direction away from incoming air.

15. The electronic device as recited in claim 9, wherein the air mover assembly comprises:
   a first air mover operable to move air from the first region towards the exhaust outlet; and
   a second air mover operable to move air from the second region towards the exhaust outlet, and wherein when the air mover assembly is operating, the first air mover and the second air mover maintain a non-zero speed differential that is less than 15%.

* * * * *